United States Patent
Mizushima et al.

(10) Patent No.: US 8,189,632 B2
(45) Date of Patent: May 29, 2012

(54) LASER EMISSION DEVICE AND IMAGE DISPLAY DEVICE USING THE SAME

(75) Inventors: Tetsuro Mizushima, Osaka (JP);
Akihiro Morikawa, Osaka (JP);
Kazuhisa Yamamoto, Osaka (JP);
Kenichi Kasazumi, Osaka (JP);
Hiroyuki Furuya, Nara (JP); Shinichi Kadowaki, Hyogo (JP)

(73) Assignee: Panasonic Corporation, Osaka (JP)

( * ) Notice: Subject to any disclaimer, the term of this patent is extended or adjusted under 35 U.S.C. 154(b) by 711 days.

(21) Appl. No.: 12/443,258

(22) PCT Filed: Sep. 28, 2007

(86) PCT No.: PCT/JP2007/069069
§ 371 (c)(1), (2), (4) Date: Mar. 27, 2009

(87) PCT Pub. No.: WO2008/041648
PCT Pub. Date: Apr. 10, 2008

(65) Prior Publication Data
US 2010/0033508 A1 Feb. 11, 2010

(30) Foreign Application Priority Data

Sep. 29, 2006 (JP) ................................ 2006-267844
Sep. 29, 2006 (JP) ................................ 2006--267845

(51) Int. Cl.
*H01S 3/00* (2006.01)
(52) U.S. Cl. ............... 372/38.02; 372/38.01; 372/38.07; 372/29.015; 372/29.014

(58) Field of Classification Search ............... 372/38.02, 372/38.01, 38.07, 29.015, 29.014
See application file for complete search history.

(56) References Cited

U.S. PATENT DOCUMENTS

| | | | |
|---|---|---|---|
| 4,689,482 A | 8/1987 | Horikawa et al. | |
| 5,359,619 A | 10/1994 | Yoshida et al. | |
| 2004/0041744 A1* | 3/2004 | Inoue et al. | 345/1.3 |
| 2004/0239818 A1* | 12/2004 | Sugiyama et al. | 348/745 |
| 2006/0291512 A1* | 12/2006 | Borschowa | 372/38.02 |

FOREIGN PATENT DOCUMENTS

| | | |
|---|---|---|
| JP | 61-275871 | 12/1986 |
| JP | 5-343809 | 12/1993 |
| JP | 8-171061 | 7/1996 |

(Continued)

OTHER PUBLICATIONS

International Search Report issued Dec. 25, 2007 in the International (PCT) Application No. PCT/JP2007/069069.

(Continued)

*Primary Examiner* — Kinam Park
(74) *Attorney, Agent, or Firm* — Wenderoth, Lind & Ponack, L.L.P.

(57) ABSTRACT

A laser emission device comprises a plurality of laser elements, a plurality of laser driving power supplies, optical elements which uniformize the laser light amount distributions of laser lights, plural light-receiving elements, a measurement unit which measures at least the relations between the operation current values of the laser elements and the output power values of the laser lights with respect to the operation current values, and the control unit operates the laser driving power supplies according to the operation current values and the output power values so as to make the light output powers of the laser elements different from each other.

28 Claims, 10 Drawing Sheets

FOREIGN PATENT DOCUMENTS

| | | |
|---|---|---|
| JP | 2001-85798 | 3/2001 |
| JP | 2001-267681 | 9/2001 |
| JP | 2002-120395 | 4/2002 |
| JP | 2003-338660 | 11/2003 |
| JP | 2004-70065 | 3/2004 |
| JP | 2004-214225 | 7/2004 |
| JP | 2004-279943 | 10/2004 |
| JP | 2005-64300 | 3/2005 |

OTHER PUBLICATIONS

Written Opinion of the ISA issued Dec. 25, 2007 in the International (PCT) Application No. PCT/JP2007/069069.

Written Opinion of the IPEA issued Sep. 22, 2008 in the International (PCT) Application No. PCT/JP2007/069069.

International Preliminary Report on Patentability issued Dec. 5, 2008 in the International (PCT) Application No. PCT/JP2007/069069.

* cited by examiner

| sample No. | Iop1(mA) | η (W/A) |
|---|---|---|
| a | 1330 | 0.97 |
| b | 1310 | 0.98 |
| c | 1300 | 0.99 |
| d | 1300 | 0.99 |
| e | 1380 | 0.94 |
| f | 1320 | 0.98 | light output power : 1W

| laser array No. | IopLA(A) |
|---|---|
| A | 3.97 |
| B | 3.94 |
| C | 3.92 |
| D | 4.04 |
| E | 4.18 |
| F | 4.01 |

LASER EMISSION DEVICE AND IMAGE DISPLAY DEVICE USING THE SAME

TECHNICAL FIELD

The present invention relates to a laser emission device using a laser light as a light source, and an image display device using the laser emission device.

BACKGROUND ART

High-power visible light sources having high monochromaticity have been demanded as light sources for an image display device which displays image on a screen. When laser light sources of three primary colors, i.e., red, green, and blue are used as these light sources, the reproducible color range can be largely broadened because of their strong monochromaticity. As for the red or blue light source, a high-power laser light source can be configured using a small-size and high-efficiency semiconductor laser. Further, as for the green light source, a small-size, high-efficiency, and high-power laser source can be realized by using a green laser due to a second-order harmonic generation which uses a semiconductor laser as an excitation light source (hereinafter referred to as a SHG green laser).

By the way, in order to use a semiconductor laser as a laser emission device which is a light source for an image display device, a W-class light output power is required for each of red, green, and blue. Particularly for red and blue, it is necessary to configure the laser emission device using at least five to ten or more semiconductor laser elements, and it is demanded that the laser emission device as a whole should have a high efficiency, a low power consumption, and a long lifetime by devising the way of using these plural laser elements.

As an example of such laser emission device, there has been disclosed a technique of extending the lifetime of a semiconductor laser array which outputs plural beams, not in a display application for which high luminance is required but in a beam scanning device for which high resolution is required (for example, refer to Patent Document 1). FIG. 16 is a block diagram illustrating a functional configuration of such beam scanning device. To be specific, in FIG. 16, a usable LD (laser) selection means 1 judges the emission efficiencies of the respective laser diodes or whether the laser diodes are used or not, according to the contents such as control signals for drive-controlling the laser diodes or data as to whether the laser diodes have been used or not for the previous job or printing of the previous page, which contents are stored in a memory 3, and selects laser diodes to be used next from among the laser diodes in the semiconductor laser array 5. An LD control means 2 drive-controls the laser diodes which are selected by the usable LD selection means 1 and a printing mode input means 4, and controls the light amount of the semiconductor laser array 5 at start-up. In this way, the laser diodes having less deteriorations are preferentially selected according to such as the levels of their emission efficiencies, and thereby the respective laser diodes are equally used. As the result, the lifetime of the semiconductor laser array 5 is extended.

On the other hand, Patent Document 2 discloses a laser light source which measures the temporal deterioration rates of the output efficiencies of the respective semiconductor lasers, and performs control so as to make the light output powers of the respective semiconductor lasers different from each other according to the measured values, thereby to reduce the light output power of the semiconductor laser having relatively large temporal deterioration rate to extend the live thereof, thereby extending the cycle of replacement or maintenance for the laser light source.

Further, Patent Document 3 discloses, as a configuration which hardly deteriorates the lifetime, a configuration which multiplexes the light beams emitted from plural semiconductor laser elements to obtain a single laser output, and controls the laser outputs from the plural semiconductor elements to a rated value or below.

Furthermore, Patent Document 4 proposes a method of halting current injection into a faulty laser light source, and balancing the light output power using other laser light sources. Patent Documents 5, 6, and 7 propose a method of preparing a spare element for a faulty or abnormal laser light source, and compensating the output power by using the spare element instead of the faulty or abnormal laser light source, thereby to stabilize the power of the laser light source.

Patent Document 1: Japanese Published Patent Application No. Hei.8-171061
Patent Document 2: Japanese Published Patent Application No. 2003-338660
Patent Document 3: Japanese Published Patent Application No. 2004-214225
Patent Document 4: Japanese Published Patent Application No. 2004-279943
Patent Document 5: Japanese Published Patent Application No. 2002-120395
Patent Document 6: Japanese Published Patent Application No. 2001-267681
Patent Document 7: Japanese Published Patent Application No. Hei.5-343809

DISCLOSURE OF THE INVENTION

Problems to be Solved by the Invention

In the above-described conventional examples, however, there is described no specific configuration of a light source using plural semiconductor laser elements, which can realize a long lifetime on the premise of high efficiency and low power consumption which are required for a laser emission device to be used in an image display device.

While Patent Document 3 discloses a method of, when part of a laser device breaks down, lowering the luminance of a display image by reducing the light output power to control the laser image formation device, or using the laser device with reducing the laser output power to increase the lifetime of the laser, these methods cannot avoid reduction in the luminance of image due to power reduction. Further, while Patent Documents 4, 5, 6 and 7 adopt a method of compensating the power of the deteriorated laser light source, the adopted method is for compensating the reduced power or deteriorated element without considering to make the laser light element emit light with the lowest power consumption.

The present invention is made to concretely solve the above-described problems and has for its object to provide a laser emission device which can use a high-luminance and high-monochromaticity light with high efficiency and low power consumption, and which can be used with a long lifetime, and an image display device using the laser emission device.

Measures to Solve the Problems

In order to solve the above-described problems, according to Claim 1 of the present invention, there is provided a laser emission device comprising: a plurality of laser elements; a plurality of laser driving power supplies which inject currents into the plural laser elements; optical elements which uniformize the laser light amount distributions emitted from the plural laser elements; light-receiving elements which receive parts of the laser lights from the respective laser elements; a measurement unit which measures at least the respective operation current values of the plural laser elements and the output power values of the respective laser lights with respect to the operation current values; and a control unit which compares at least the operation current values of the plural laser elements and the output power values of the laser lights with respect to the operation current values among the plural laser elements, and operates the laser elements so that the laser elements having the higher efficiencies have the higher light output powers than the laser elements having the lower efficiencies.

Thereby, the laser emission device can be operated with increased ratios of the output powers from the laser elements having the higher emission efficiencies with a constant light output power and a constant light amount distribution obtained. That is, the power consumption of the whole laser emission device can be reduced by preferentially using the laser elements of the higher efficiency, and further, the lifetime of the laser element can be lengthened by suppressing the output power of the laser element having initial failure or adjustment failure.

According to Claim 2 of the present invention, in the laser emission device defined in Claim 1, the control unit selects the laser elements having the higher laser light output values with respect to the operation current values from among the plural laser elements, and operates only the selected laser elements.

Thereby, the power consumption can be reduced by selectively operating the laser elements having the higher emission efficiencies, and an increase in lifetime of the laser emission device can be achieved by using the unselected laser element as a spare element.

According to Claim 3 of the present invention, in the laser emission device defined in Claim 1, the measurement unit further measures the respective operation voltages of the plural laser elements when measuring the output power values of the laser lights with respect to the operation current values of the plural laser elements, and the control unit operates the laser elements so that the laser elements having the higher efficiencies have the higher light output powers than the laser elements having the lower efficiencies, based on the electricity-to-light conversion efficiencies of the respective laser elements which are calculated from the output power values of the laser lights of the respective laser elements and the operation power values that are the products of the operation current values and the operation voltage values of the respective laser elements.

Thereby, the plural laser elements can be driven so as to increase the total electricity-to-light conversion efficiency of the laser emission device. By increasing the electricity-to-light conversion efficiency, the calorific power which causes not light but loss in the laser elements can be reduced. Though the lifetime of the laser element is shortened with an increase in temperature and a large calorific power of the laser element itself also leads to a reduction in its lifetime, such reduction in lifetime can be avoided. Further, although heat generation in the laser element also leads to a reduction in laser emission efficiency,-such reduction in laser emission efficiency can be minimized.

According to Claim 4 of the present invention, in the laser emission device defined in Claim 1, the control unit operates the laser elements so that the laser elements having the higher visual stimulus powers with respect to the operation current values have the higher light output powers than the laser elements having the lower visual stimulus powers, based on the operation current values of the laser elements and the visual stimulus powers that are the products of the visual stimulus coefficients as functions of the oscillation wavelengths of the laser elements and the output power values of the laser lights.

Thereby, the laser element which can efficiently apply stimulus to human beings can be preferentially used. Although the display device becomes inefficient when the wavelength of the laser light which serves as stimulus applied to human beings is low even though the laser light output power (W) is large, such inefficiency can be avoided.

According to Claim 5 of the present invention, the laser emission device defined in Claim 3 includes a plurality of laser elements having different oscillation wavelengths, and, the control unit operates the laser elements so that the laser elements having the higher visual stimulus efficiencies have the higher light output powers than the laser elements having the lower visual stimulus efficiencies, based on the visual stimulus efficiencies of the respective laser elements which are calculated from the operation current values of the laser elements and the visual stimulus powers that are the products of the visual stimulus coefficients as functions of the oscillation wavelengths of the respective laser elements and the output power values of the laser lights of the respective laser elements.

Thereby, the stimulus can be applied to human beings at a low power, and heat generation in the laser element can be suppressed, thereby realizing a low power consumption and a long lifetime for the laser emission device used for a display apparatus.

According to Claim 6 of the present invention, in the laser emission device defined in Claim 4 or 5, the measurement unit measures the oscillation wavelengths of the laser elements.

Thereby, variation in the visual stimulus to human beings due to oscillation wavelength shift can be measured.

According to Claim 7 of the present invention, in the laser emission device defined in any of Claims 1 to 6, the measurement unit measures the temperatures of the laser elements.

Thereby, it is possible to calculate the oscillation wavelength shift due to the temperature of the semiconductor laser, and further calculate variation in the visual stimulus to human beings. Further, appropriate output control in response to the laser element temperature variation can be performed.

According to Claim 8 of the present invention, in the laser emission device defined in any of Claims 1 to 7, the laser elements are intermittently driven by the laser driving power supplies.

Thereby, even when the laser elements output the same average output power, the thermal burden applied to the laser elements can be reduced, and thus a long lifetime and a low power consumption can be achieved.

According to Claim 9 of the present invention, in the laser emission device defined in any of Claims 1 to 8, the laser elements are operated with emitting the laser lights at the light output powers in a range from a predetermined rated value to 1.2 times of the rated value.

Thereby, since the number of laser elements selected to obtain a required output power can be reduced, the laser emission device can be operated with a lower power consumption and a higher emission efficiency.

According to Claim 10 of the present invention, in the laser emission device defined in any of Claims 1 to 9, the measurement unit measures the operation current values or the operation power values of the laser elements which are operated with the output power values of the laser lights or the visual stimulus powers being kept at a constant value, and the control unit includes a storage unit which stores the measured values obtained by the measurement unit for the respective laser elements, and an arithmetic unit which calculates the numerical changes of the measured values.

Thereby, deterioration of the laser elements in the state of having a constant light output power or giving a constant stimulus to human beings is judged, and on the basis of this judgment, the laser emission device is operated with varying the light output powers of the laser elements or with selecting appropriate laser elements. Further, the output power of the laser emission device can be stabilized by not selecting a laser element showing abrupt variation or a laser element having significant deterioration with time.

According to Claim 11 of the present invention, in the laser emission device defined in Claim 7, the temperatures of the laser elements are varied when emitting laser lights, the measurement unit measures the output power values of the laser lights or the visual stimulus powers with respect to the laser element temperatures for the respective laser elements, and the control unit includes a storage unit which stores the output power values of the laser lights or the visual stimulus powers with respect to the laser element temperatures for the respective laser elements, and controls the light output powers of the respective laser elements according to the laser element temperatures by using the values stored in the storage unit.

Thereby, output power reduction or wavelength shift due to the laser element temperature can be stored, and appropriate laser elements can be selected according to the temperature when the laser emission device is started up, and further, the laser elements can be switched during being operated when the operation environment varies.

According to Claim 12 of the present invention, in the laser emission device defined in Claim 7, the temperatures of the laser elements are varied when emitting laser lights, the measurement unit measures the output power values of the laser lights and the operation current values or the operation power values with respect to the laser element temperatures, and the control unit includes a storage unit which stores the output power values of the laser lights and the operation current values or the operation power values with respect to the laser element temperatures, and operates the laser elements using the values stored in the storage unit when the laser emission device is started up.

Thereby, the laser emission device can obtain a required laser output power instantly when it is started up even if environmental variation or laser element deterioration occurs, thereby enabling instant start-up of the display device.

According to Claim 13 of the present invention, in the laser emission device defined in Claim 7, the temperatures of the laser elements are varied when emitting laser lights, the measurement unit measures the visual stimulus powers and the operation current values or the operation power values with respect to the laser element temperatures, and the control unit includes a storage unit which stores the visual stimulus powers and the operation current values or the operation power values with respect to the laser element temperatures, and operates the laser elements using the values stored in the storage unit when the laser emission device is started up.

Thereby, the laser emission device can obtain a required visual stimulus power instantly when the display device is started up even if environmental variation or laser element deterioration occurs, thereby enabling instant start-up of the display device.

According to Claim 14 of the present invention, the laser emission device defined in Claim 1 includes N pieces of laser elements (N: integer satisfying $N \geq 2$), and (N−1) or less pieces of laser elements among the N pieces of laser elements being selected to make them emit lights.

Thereby, the power consumption can be reduced by selectively operating the laser elements having the higher emission efficiencies, and the lifetime of the laser emission device can be increased by using the unselected laser element as a spare element.

According to Claim 15 of the present invention, in the laser emission device defined in Claim 14, an electricity-to-light conversion efficiency $P2[W]/P1[W]$ which is obtained by dividing the output power value $P2[W]$ of the laser light of the laser element by the operation power value $P1[W]$ is used as an emission efficiency, and the (N−1) or less pieces of laser elements are selected from the N pieces of laser elements in descending order of emission efficiency, and the selected laser elements are made to emit lights.

Thereby, since the laser elements to emit lights are selected in descending order of electricity-to-light conversion efficiency, reduction in power consumption of the laser emission device can be achieved. Further, since the heat generated from the laser emission device can be minimized, laser deterioration due to high temperature is avoided to increase the lifetimes of the lasers.

According to Claim 16 of the present invention, in the laser emission device defined in Claim 14, a visual stimulus efficiency $\alpha \times P2[W]/P1[W]$ which is obtained by dividing the visual stimulus power $\alpha \times P2[W]$ that is the product of the output power value $P2[W]$ of the laser light of the laser element and the visual stimulus coefficient $\alpha$ by the operation power value $P1[W]$ is used as an emission efficiency, and the (N−1) or less pieces of laser elements are selected from the N pieces of laser elements in descending order of emission efficiency, and the selected laser elements are made to emit lights.

Thereby, since the laser elements to emit lights are selected in descending order of visual stimulus efficiency, reduction in power consumption of the laser emission device can be achieved. Further, since the heat generated from the laser emission device can be minimized, laser deterioration due to high temperature is avoided to increase the lifetimes of the lasers.

According to Claim 17 of the present invention, in the laser emission device defined in Claim 14, the (N−1) or less pieces of laser elements are selected from the N pieces of laser elements in ascending order of oscillation threshold value to make the selected laser elements emit lights.

Thereby, since the laser elements to emit lights are selected in ascending order of oscillation threshold value, reduction in power consumption of the laser emission device can be achieved. Further, since the heat generated from the laser emission device can be minimized, laser deterioration due to high temperature is avoided to increase the lifetimes of the lasers.

According to Claim 18 of the present invention, in the laser emission device defined in any of Claims 15 to 17, calculations of the emission efficiencies and the oscillation threshold values are performed while the laser elements are manufactured.

According to Claim 19 of the present invention, in the laser emission device defined in any of Claims 15 to 17, calculations of the emission efficiencies and the oscillation threshold values are performed immediately before the laser emission device is used.

According to Claim 20 of the present invention, in the laser emission device defined in any of Claims 15 to 17, calculations of the emission efficiencies and the oscillation threshold values are performed while the laser emission device is used.

According to Claim 21 of the present invention, in the laser emission device defined in Claim 15 or 16, the (N−1) or less pieces of laser elements are selected from the N pieces of laser elements in descending order of emission efficiency, and the selected laser elements are made to emit lights at the laser light output power values corresponding to the characteristics of the emission efficiencies.

Thereby, since the laser elements to emit lights are selected in descending order of emission efficiency, reduction in power consumption of the laser emission device can be achieved. Further, since the heat generated from the laser emission device can be minimized, laser deterioration due to high temperature is avoided to increase the lifetimes of the lasers.

According to Claim 22 of the present invention, in the laser emission device defined in Claim 15 or 16, calculation of the emission efficiencies is performed while the respective N pieces of laser elements are lighted, and when the emission efficiency of a laser element which is lighted becomes lower than the emission efficiency of a laser element which is not lighted, the laser element being lighted is replaced.

Thereby, when one of the plural laser elements being used is deteriorated and reduced in its output power, a spare laser element is used instead of the deteriorated element, whereby increase in the lifetime of the laser emission device can be achieved. Further, since the laser element whose light emission is stopped is used as a spare element, the lifetime and reliability of the light emission device can be increased.

According to Claim 23 of the present invention, in the laser emission device defined in Claim, the (N−1) or less pieces of laser elements are selected from the N pieces of laser elements in ascending order of oscillation threshold value, and the selected laser elements are made to emit lights at the laser light output power values corresponding to the characteristics of the oscillation threshold values.

Thereby, since the laser elements to emit lights are selected in ascending order of oscillation threshold value, reduction in power consumption of the laser emission device can be achieved. Further, since the heat generated from the laser emission device can be minimized, laser deterioration due to high temperature is avoided to increase the lifetimes of the lasers.

According to Claim 24 of the present invention, in the laser emission device defined in Claim 17, calculation of the oscillation threshold values is performed while the respective N pieces of laser elements are lighted, and when the oscillation threshold value of a laser element which is lighted becomes higher than the oscillation threshold value of a laser element which is not lighted, the laser element being lighted is replaced.

Thereby, when one of the plural laser elements being used is deteriorated and reduced in its output power, a spare laser element is used instead of the deteriorated element, whereby increase in the lifetime of the laser emission device can be achieved. Further, since the laser element whose light emission is stopped is used as a spare element, the lifetime and reliability of the light emission device can be increased.

According to Claim 25 of the present invention, there is provided an image display device comprising: a laser light source which emits laser light; a spatial modulation element which modulates the laser light emitted from the laser light source; and the laser emission device disclosed in any of Claims 1 to 24 being used as the laser light source.

According to Claim 26 of the present invention, there is provided an image display device comprising: a plurality of laser light sources; a projection unit which projects laser lights emitted from the laser light sources; and the laser emission device disclosed in any of Claims 1 to 24 being used as the laser light sources.

Thereby, a low-power-consumption and long-life image display device can be realized.

According to Claim 27 of the present invention, the image display device defined in Claim 25 or 26 includes laser light sources which emit red, green, and blue laser lights, respectively, and the visual stimulus efficiency of the laser light source of at least one color among red, green, and blue being calculated to control the color temperature of the image display device.

Thereby, reduction in power consumption of the image display device can be achieved by adjusting the white color so as to reduce the power consumption in the three-color laser light sources.

According to Claim 28 of the present invention, the image display device defined in Claim 25 or 26 includes laser light sources of four or more colors including at least red, green, and blue, and the laser light sources of the respective colors being controlled so that the output powers from the laser light sources having the higher visual stimulus efficiencies become larger.

Thereby, the output powers from the light sources of the respective colors are arbitrarily determined, and control is carried out so that the output power from the laser light source of the lower power consumption becomes larger even when the same color is displayed, whereby a power saving and a long lifetime for the image display device can be realized.

Effects of the Invention

The laser emission device of the present invention includes a plurality of laser elements, and operates at least one laser element among the plural laser elements so that the at least one laser element has its light output power that is different from those of other laser elements, based on the characteristic values such as the operation current values, the operation power values, the visual stimulus coefficients, or the visual stimulus efficiencies. Therefore, the output power from the laser element having the lower power consumption, higher efficiency, and lower heat generation becomes larger, thereby realizing a high-efficiency, low-power-consumption, and long-life laser emission device.

Further, the laser emission device of the present invention includes N pieces of laser elements (N: integer satisfying $N \geq 2$), and emits light using (N−1) or less pieces of laser elements. Therefore, when one of the plural laser elements being used is deteriorated and reduced in its output power, a spare laser element is used instead of the deteriorated laser element, and thereby the lifetime of the laser emission device can be increased. Further, since the laser elements to emit lights are selected in descending order of emission efficiency or in ascending order of oscillation threshold value, reduction in power consumption of the laser emission device can be achieved. Further, since the heat generated from the laser emission device can be minimized, laser deterioration due to high temperature is avoided to increase the lifetimes of the laser elements.

Figure 1:
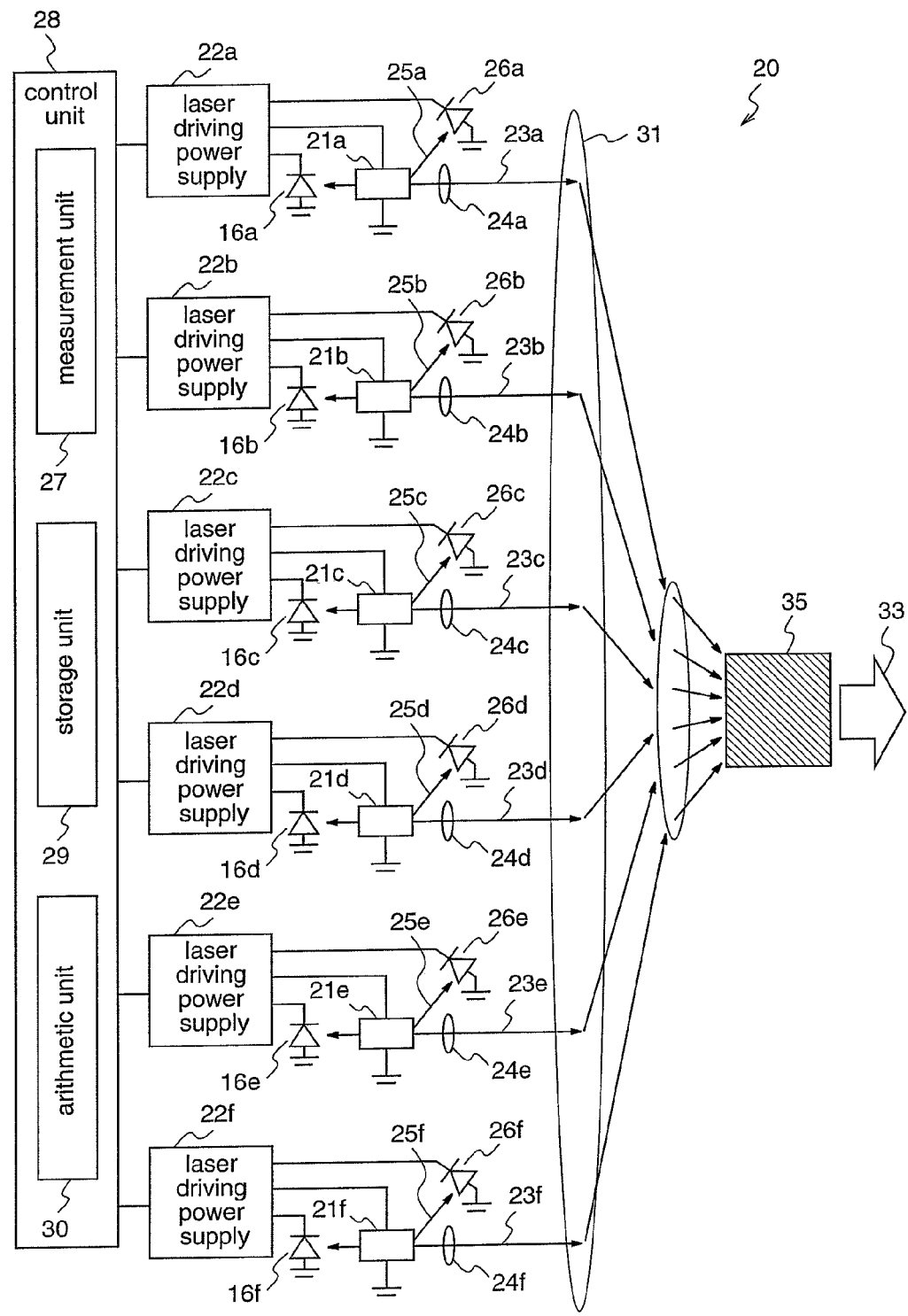
FIG. 1 is a schematic configuration diagram of a laser emission device according to a first embodiment of the present invention.

DESCRIPTION OF REFERENCE NUMERALS 20, 60, 80, 90, 200, 300 . . . laser emission device
21, 21a, 21b, 21c, 21d, 21e, 21f, 81, 91 . . . laser element
22, 22a, 22b, 22c, 22d, 22e, 22f, 89, 89A, 89B, 89C, 89D, 89E, 89F, 92 . . . laser driving power supply
23, 23a, 23b, 23c, 23d, 23e, 23f, 120 . . . laser light
24, 24a, 24b, 24c, 24d, 24e, 24f . . . optical element
25, 25a, 25b, 25c, 25d, 25e, 25f . . . partial light
26, 26a, 26b, 26c, 26d, 26e, 26f, 49 . . . light-receiving element
27 . . . measurement unit
28, 67 . . . control unit
29 . . . storage unit
30 . . . arithmetic unit
83, 93 . . . optical fiber
32 . . . output terminal
33, 88, 96 . . . output light
35, 84, 86, 94 . . . uniformization optical element
87, 95 . . . output facet
61, 101a, 112a . . . red laser light source (R light source)
62, 101b, 112b . . . green laser light source (G light source)
63, 101c, 112c . . . blue laser light source (B light source)
64 . . . red laser element
65 . . . green laser element
66 . . . blue laser element
68 . . . red control part
69 . . . green control part
70 . . . blue control part
71 . . . red optical fiber
72 . . . green optical fiber
73 . . . blue optical fiber
74 . . . red uniformization optical element
75 . . . green uniformization optical element
76 . . . blue uniformization optical element
77 . . . red output light
78 . . . green output light
79 . . . blue output light
82A, 82B, 82C, 82D, 82E, 82F . . . laser array
104a, 104b, 104c . . . field lens
105a, 105b, 105c . . . spatial light modulation element
106 . . . dichroic prism
107 . . . projection lens
108 . . . screen
111 . . . planar illuminating device
112 . . . laser light source unit
114 . . . bundle fiber
115 . . . light guide plate type uniformization optical element
125, 126 . . . glass substrate
127 . . . liquid crystal
128 . . . pixel
129 . . . polarization plate
131 . . . liquid crystal plate
132 . . . liquid crystal display device
133 . . . liquid crystal display panel
211, 231 . . . multistripe semiconductor laser
212, 232 . . . control circuit
214, 234 . . . laser element stripe

BEST MODE TO EXECUTE THE INVENTION

Hereinafter, laser emission devices and image display devices using the same according to the embodiments of the present invention will be described with reference to the figures. Note that elements given the same reference numerals in the figures might be omitted for description.

(Embodiment 1)

A description will be given of a laser emission device according to a first embodiment of the present invention, which corresponds to Claims 1 to 13.

FIGS. 1 to 4 are diagrams illustrating a laser emission device 20 of this first embodiment.

With reference to FIG. 1, the laser emission device 20 of this first embodiment comprises a plurality of laser elements 21, i.e., six laser elements 21a, 21b, 21c, 21d, 21e, and 21f, a plurality of laser driving power supplies 22 for driving these laser elements 21, a plurality of optical elements 24 for converting the wave fronts of laser lights 23 emitted from the laser elements 21, and a plurality of light-receiving elements 26 for receiving partial lights 25 of the laser lights 23 emitted from the laser elements 21.

The plural laser driving power supplies 22 are composed of six laser driving power supplies 22a, 22b, 22c, 22d, 22e, and 22f which drive the corresponding six laser elements 21a, 21b, 21c, 21d, 21e, and 21f, respectively. Likewise, the laser lights 23 are composed of six laser lights 23a, 23b, 23c, 23d, 23e, and 23f, and the partial lights 25 are composed of six partial lights 25a, 25b, 25c, 25d, 25e, and 25f. Likewise, the plural optical elements 24 are composed of six optical elements 24a, 24b, 24c, 24d, 24e, and 24f, and the plural light-receiving elements 26 are composed of six light-receiving elements 26a, 26b, 26c, 26d, 26e, and 26f.

Further, the laser emission device 20 of this first embodiment includes a measurement unit 27 which measures the operation current values of the laser elements 21 and the output power values of the laser lights 23 with respect to the operation current values, and a control unit 28 which controls the entirety of the laser emission device 20 on the basis of the values measured by the measurement unit 27. The control unit 28 makes the laser driving power supplies 22 operate the six laser elements 21 such that the output powers from the laser elements 21 are different from each other according to the operation current values and the output power values of the laser elements 21, thereby controlling the entirety of the laser emission device 20. For example, the output powers from the five laser elements excluding the laser element 21e are made equal to each other while only the output power from the laser element 21e is halved.

Further, in order to secure a spare laser, laser elements to be used, for example, five laser elements 21a, 21b, 21c, 21d, and 21f, are selected from among the six laser elements 21, and only the selected five laser elements 21a, 21b, 21c, 21d, and 21f are operated by the corresponding laser driving power supplies 22 while the laser driving power supply 22e for the laser element 21e is not operated, thereby to control the entirety of the laser emission device 20. By providing the non-operated laser element, a spare laser can be secured, and further, the total operation current value can be reduced to save the power consumption.

The measurement unit 27 measures such as the operation current values of the laser elements 21 every time the laser emission device 20 is operated. The measurement unit 27 measures the relations of the output power values of the laser lights 23 to the operation current values by receiving the partial lights 25 thereof with the light-receiving elements 26, respectively. Since such measurement is carried out every time the laser emission device is operated, optimum control is achieved in the operating envelopment and the laser element state.

Further, the measurement unit 27 is desired to measure such as the operation current values of the laser elements 21 for every constant operation period when the laser emission device is continuously driven. Performing the measurement also during the continuous operation enables optimum control for the laser emission device according to the state transition.

The control unit 28 further includes a storage unit 20 in which the measurement time and the measured value are stored for each laser element 21 every time such as the operation current values of the laser elements 21 which are operated at the constant light output power are measured by the measurement unit 27. The control unit 28 including the storage unit 29 controls the operation current values on the basis of the stored measured values to operate the laser driving power supplies 22 so that the light output powers from the laser elements are made different from each other. Further, the control unit 28 compares the measured values with the stored past measured values to detect abnormality of some laser element, and selects only normal laser elements to be operated by the laser device power supplies 22. Further, also when no measurement is performed to a certain laser element, the control unit 28 uses the stored measured value thereof and compares the same with the measured values of other laser elements, and makes the laser driving power supplies 22 operate the laser elements so that the light output powers from the laser elements are different from each other.

The control unit 28 performs control so as to make the output powers from the laser elements 21 different from each other according to the measured values obtained by the measurement unit 27. For example, the control unit 28 selects the laser elements 21 to be used from among all the laser elements 21 with leaving some laser elements 21, and makes the laser driving power supplies 22 operate only the selected laser elements 21.

The laser emission device 20 includes an optical element for uniformizing the light amount distributions of the laser lights 23 which are emitted from the plural laser elements 21. In this first embodiment, the laser lights 23a to 23f are guided into the uniformization optical element 35 by a light focusing optical system 31. Adopted as the uniformization optical element 35 is, for example, a rod type integrator, a multimode fiber, or a lightguide plate having a planar configuration, which uniformizes the light amount distribution by internal reflection. Even when the respective output powers of the laser lights 23a to 23f are controlled to be different from each other by the uniformization optical element 35, the output light 33 from the laser emission device 20 has not a polarized light amount distribution but a uniformized light amount distribution, and thus the laser emission device 20 serves as a light source suited to an image display device. Further, the uniformization optical element 35 may be of a lens array type which overlaps plural images, besides the inner reflection type.

As for the light-receiving elements, light-receiving elements 16 which monitor the back lights of the laser elements 21 may be used. Further, instead of providing a light-receiving element for each laser element, the lights from the laser elements 21 may be sequentially received to be measured by a single light-receiving element.

Next, the fundamental operation of the laser emission device 20 will be described with reference to FIG. 1. The description will be given of the case where the laser emission device 20 is a red laser light source comprising high-power red semiconductor lasers as the laser elements 21.

Each of the high-power red semiconductor lasers has a center wavelength of 638 nm, and a rated light output power of 500 mW in continuous output.

Figures 2, 3:
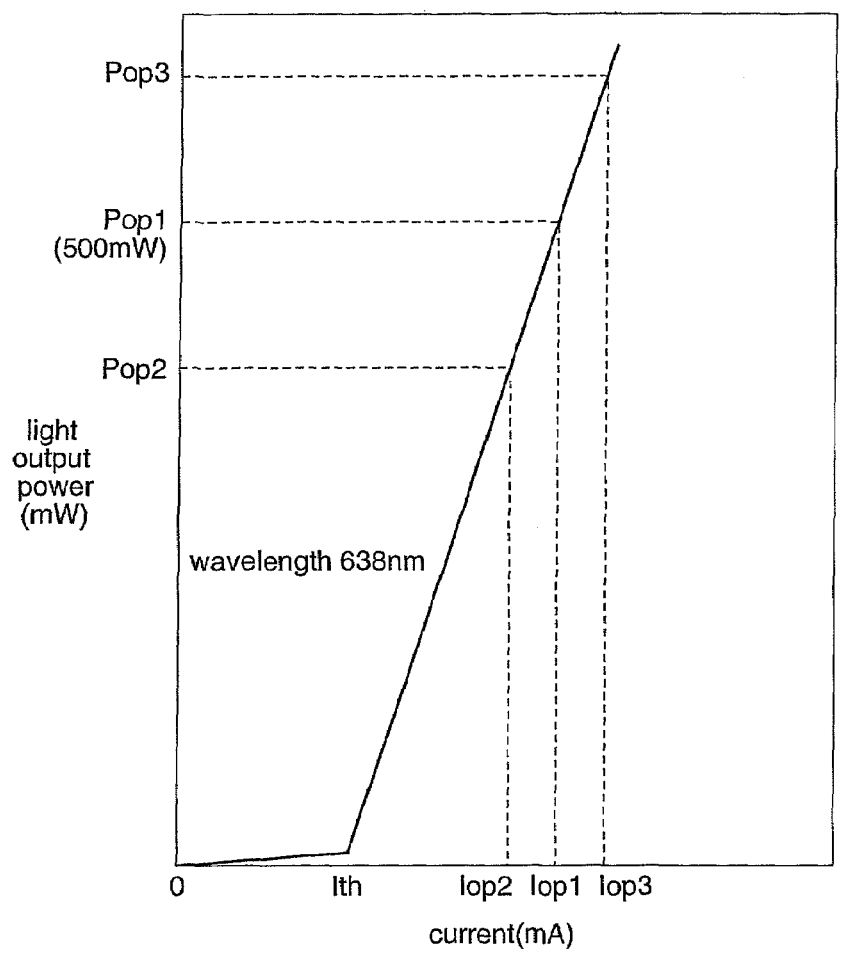
FIG. 2 is a diagram for explaining the characteristics of laser elements used in the laser emission device of the first embodiment, and a method for measuring the characteristics.
FIG. 3 is a table showing the characteristics of the plural laser elements used in the laser emission device of the first embodiment.

As for the characteristics of the light output powers with respect to the injected currents in the red semiconductor laser elements used in the first embodiment (hereinafter referred to as laser elements), the characteristics of the laser element 21b shown in FIG. 1 will be described. In FIG. 2, the abscissa shows the current injected into the laser element 21b as an input, and the ordinate shows the light output power from the laser element 21b. A threshold current value Ith at which the laser element 21b reaches laser oscillation is 800 mA. An operation current value Iop1 at which the laser element 21b outputs the rated light output of 500 mW is 1310 mA. Further, Pop2 denotes a recommended light output value which is 80 percents of the rated output value recommended when the laser element is used, and this recommended light output value Pop2 is 400 mW. A slope efficiency value η is defined as formula (1) using the Pop1 and Pop2.

$$\eta = \frac{Pop1 - Pop2}{Iop1 - Iop2}(W/A) \quad (1)$$

wherein Iop2 indicates the operation current value obtained when the laser element 21b outputs the light output Pop2, which is 1208 mA. The slope efficiency value η of the laser element 21b which is obtained by substituting these values is 0.98 W/A (refer to the slope efficiency value η of sample b shown in FIG. 3).

By the way, the high-power red semiconductor laser is configured such that it has a window structure at its facet for emitting laser light, and light absorption hardly occurs in the vicinity of the facet of the laser chip. If such laser element is used at an output power which significantly exceeds the rated light output power, there occurs a drawback that an element whose ensured lifetime is rapidly shortened might be generated with a certain probability. However, so long as the laser element is generally used at a light output power which is about 1.2 times of the rated light output power, the number of elements to be rapidly deteriorated is very small, and rapid deterioration hardly occurs in the selected lasers.

The lifetimes of laser elements (including the facet characteristics) are statistically ensured in a large general population, and the lifetimes of the individual laser elements have variations although they are within the ensured range. Accordingly, when such laser elements are used in equipment such as the laser emission device of the present invention, the lengths of lifetimes are expected for the respective laser elements in the state where the equipment is actually used, and the laser elements which are expected to have relatively long lifetimes (good facet characteristics) are selected to be used, whereby the laser elements can be used longer than the lifetimes which are ensured in the general population of the laser elements. Further, also when the laser elements are used with the light output power Pop3 that is 1.2 times of the rated value, the laser elements can be used without shortening the ensured lifetimes. In FIG. 2, the operation current value Iop3 indicates the current value required when the laser element 21b is operated with the light output power Pop3.

FIG. 3 is a table showing the operation current values Iop1 and the slope efficiency values η which are obtained when the laser elements 21 used in the laser emission device 20 of the first embodiment emit the lights of the rated output power of 500 mW.

Assuming that the laser emission device 20 using the laser elements 21a to 21f is required to emit a red light output power of 2.5 W. In this case, assuming that the six laser elements 21a to 21f evenly emit light output powers, each laser element should emit a light output power of 417 mW which slightly exceeds the recommended light output power of 400 mW. At this time, the total operation current value of the six laser elements 21a to 21f exceeds 7.4 A.

In this first embodiment, however, the output power from the laser element 21e having the maximum operation current value is reduced as shown in the table of FIG. 3. To be specific, five laser elements having relatively low operation current values are selectively operated while the laser element 21e is not operated with its output power being set to 0 mW. These five laser elements are the laser elements 21a, 21b, 21c, 21d, and 21f. In order to obtain a light output power of 2.5W from these laser elements, the light output power from each laser element is 500 mW, and therefore, each laser element should be operated within the rated output power of 500 mW. The total operation current value for the five laser elements 21a, 21b, 21c, 21d, and 21f is only 6.6 A.

In this way, the laser elements 21a, 21b, 21c, 21d, and 21f are selected from among the laser elements 21 with leaving at least one laser element 21e. Thereby, at least the operation current value required is only 6.6 A which is about 10% less than 7.4 A which is required when all the six laser elements are used, and thus the laser emission device 20 can be operated at low current consumption, i.e., low power consumption, and moreover, the unoperated spare laser can be secured.

On the other hand, in the case where the light output power required for the laser emission device 20 is not 2.5W but 2.4W, if each laser element 21 is allowed to operate at an light output power up to 600 mW which is 1.2 times the rated output power of 500 mW, the laser elements to be selected are only four elements, i.e., the laser elements 21b, 21c, 21d, and 21f. At this time, the total operation current value for the four laser elements 21b, 21c, 21d, and 21f is only 5.64 A. By the way, when the light output power of 2.4W is obtained by operating five or six laser elements, the operation current of 6.46 A or 7.31 A is required, respectively. Accordingly, when not the six laser elements but the four laser elements are operated to obtain the light output power of 2.4W, the laser emission device 20 can be operated with reduced current consumption, i.e., reduced power consumption.

The above-described selection of laser elements is performed in a short period every time the laser emission device 20 is operated from its halt state, as well as when the laser emission device 20 is newly started up. Thereby, the low-operation-current laser elements can be continuously used. Further, if the same light output power can be obtained with less number of laser elements, the laser emission device 20 can be operated with lower operation current and lower power consumption.

Moreover, the high-operation-current laser element is supposed to be in the state where the temperature environment such as radiation performance is deteriorated when it is mounted on or attached to an apparatus or in the state where the laser element itself give a sign of deterioration. In this invention, the laser element having such probability of deterioration is not continuously used as it is but put into a rest for a while to observe as to whether the degradation of temperature environment or the sign of deterioration is continued or not.

Further, when the laser emission device 20 is operated with the selected laser elements excluding at least the laser element having the maximum operation current value, the temperature environment of the rested laser element may be improved or the sign of deterioration may be eased by taking the rest, and thereby the entirety of the mounted laser elements can be efficiently used. As the result, the laser emission device can be operated with higher efficiency, lower power consumption, and longer lifetime.

It is desirable that the measured value of the unselected laser element is stored in the storage unit in the control unit while only the selected laser elements are measured for the operation current values when operated, and the measured values are compared with the measured value of the unselected laser element which is stored in the storage unit, thereby to select the laser elements to be operated. It is possible to select the most favorable laser elements including the unselected laser element by only measuring the selected laser element during operation. Further, deterioration of a spare laser can be avoided by operating the laser element only for the initial measurement and saving the same as the spare laser element. Further, in this first embodiment, the unselected laser element is the spare laser element. The laser element having the lowest operation current value or the lowest electricity-to-light conversion efficiency becomes the spare laser based on the measured value, and the spare laser is switched when the measured value changes according to the usage condition or environmental change.

While in this first embodiment the high-power red semiconductor lasers are described as the laser elements, the same effects as described above can be obtained also when a blue laser emission device 20 is configured by GaN series blue lasers, and the blue laser emission device can be operated with a high efficiency, a low power consumption, and a long lifetime.

Adopted as a green laser may be, besides a semiconductor laser, a wavelength-conversion laser element having a semiconductor laser as a fundamental wave or an excitation light. When using such wavelength-conversion laser element, the relations between the operation current values applied to plural semiconductor lasers and the light output value from the wavelength-conversion laser element is measured, and the operation current values to the semiconductor lasers are varied or the semiconductor lasers to be operated are selected, thereby to similarly control the wavelength-conversion laser.

It is possible to configure the laser emission device 20 using the green laser elements comprising such wavelength-conversion laser elements as the laser elements of this embodiment, in similar manner to that described for the high-power red semiconductor laser. Also in the green laser emission device 20 thus configured, the same effects as described for the high-power red semiconductor laser can be obtained, and the green laser emission device 20 can be operated with a high efficiency, a low power consumption, and a long lifetime.

Figure 4:
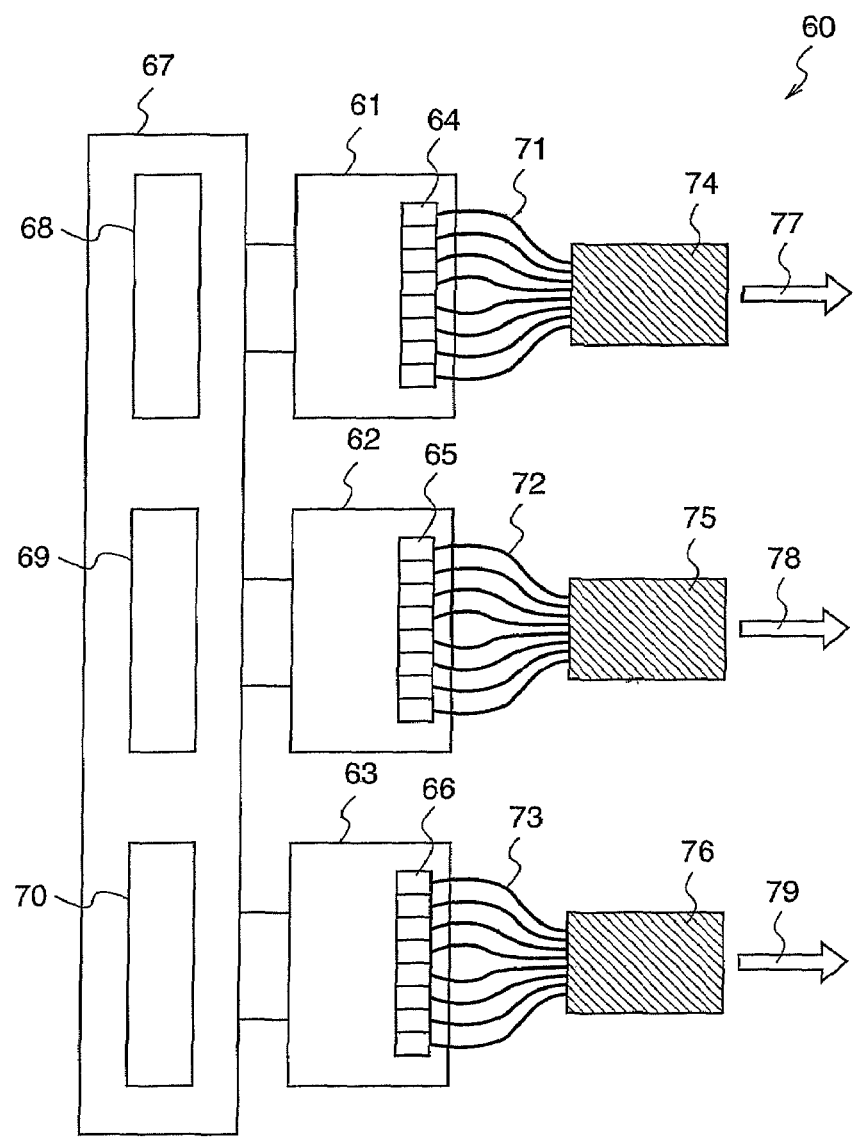
FIG. 4 is a schematic configuration diagram of a laser emission device comprising at least red, green, and blue laser light sources according to the first embodiment.

Furthermore, it is also possible to configure a laser emission device 60 shown in FIG. 4, which includes blue and green laser emission devices as light sources.

The laser emission device 60 shown in FIG. 4 includes at least a red laser light source 61, a green laser light source 62 and a blue laser light source 63 which emit red, green, and blue laser lights, respectively. The respective light sources use eight red laser elements 64, eight green laser elements 65, and eight blue laser elements 66. In each of the laser light sources, plural laser driving power supplies, plural optical elements, and plural light-receiving elements as those shown in FIG. 1 are arranged although these elements are not shown in FIG. 4, and parts of the light output powers from the respective laser elements are received by the light-receiving elements and controlled.

Further, a control unit 67 of the laser emission device 60 includes a red control unit 68, a green control unit 69, and a blue control unit 70, and these control units control the operations of the red laser light source 61, the green laser light source 62, and the blue laser light source 63, respectively. Accordingly, each of the red control unit 68, the green control unit 69, and the blue control unit 70 is provided with a measurement unit, a storage unit, and an arithmetic unit as shown in FIG. 1 although these units are not shown in FIG. 4. The laser lights emitted from the laser elements are wave-guided by eight red light fibers 71, eight green light fibers 72, and eight blue light fibers 73 to be applied to uniformization optical elements 74, 75, and 76, respectively. The laser lights of the respective colors are uniformized for their intensity distributions by at output facets of the three uniformization optical elements, and thereby a red output light 77, a green output light 78, and a blue output light 79 are taken out of the laser emission device 60. Further, a single uniformization optical element may be used for the laser light sources of the plural colors. This configuration is preferable in decreasing the number of uniformization optical elements.

As described above, the laser emission device having at least red, green, and blue output lights is most suitable as a light source for an image display device. Moreover, since the laser elements having relatively low operation current values are selected from the plural laser elements and used, the laser emission device can be operated with a high efficiency, a low power consumption, and a long lifetime. In addition, since the output lights have uniform intensity distributions at the output facets, the output lights can be applied as they are to the panel of the image display device.

When using the laser emission device as a laser light source for an image display device as described above, the effects described in this first embodiment can be made more effective by designing the device such that the lifetime of the laser light source becomes longer than the lifetimes of any other major parts, that is, by mounting many laser elements and selecting the laser elements to be operated from among the many laser elements.

By using the laser emission device of the present invention as a laser emission device of one color which has the shortest lifetime among the laser emission devices of three colors, high reliability and power saving of the image display device can be realized.

As described above, according to the laser emission device of this first embodiment, since the plural laser elements are operated so that the laser elements have different light output powers or the laser elements to be operated are selected from the plural laser elements on the basis of the operation current values or the operation power values, a laser emission device having a high efficiency, a low power consumption, and a long lifetime can be realized. Further, by using the laser emission device of the first embodiment as a light source for an image display device, reliability and power-saving property of the image display device can be significantly increased. Furthermore, since the output lights have uniform intensity distributions at the output facets, the output lights can be applied as they are to the panel of the image display device, and thereby other optical elements can be dispensed with.

(Embodiment 2)

Next, a laser emission device according to a second embodiment of the present invention which corresponds to Claims 1 to 13 will be described.

Figure 5:
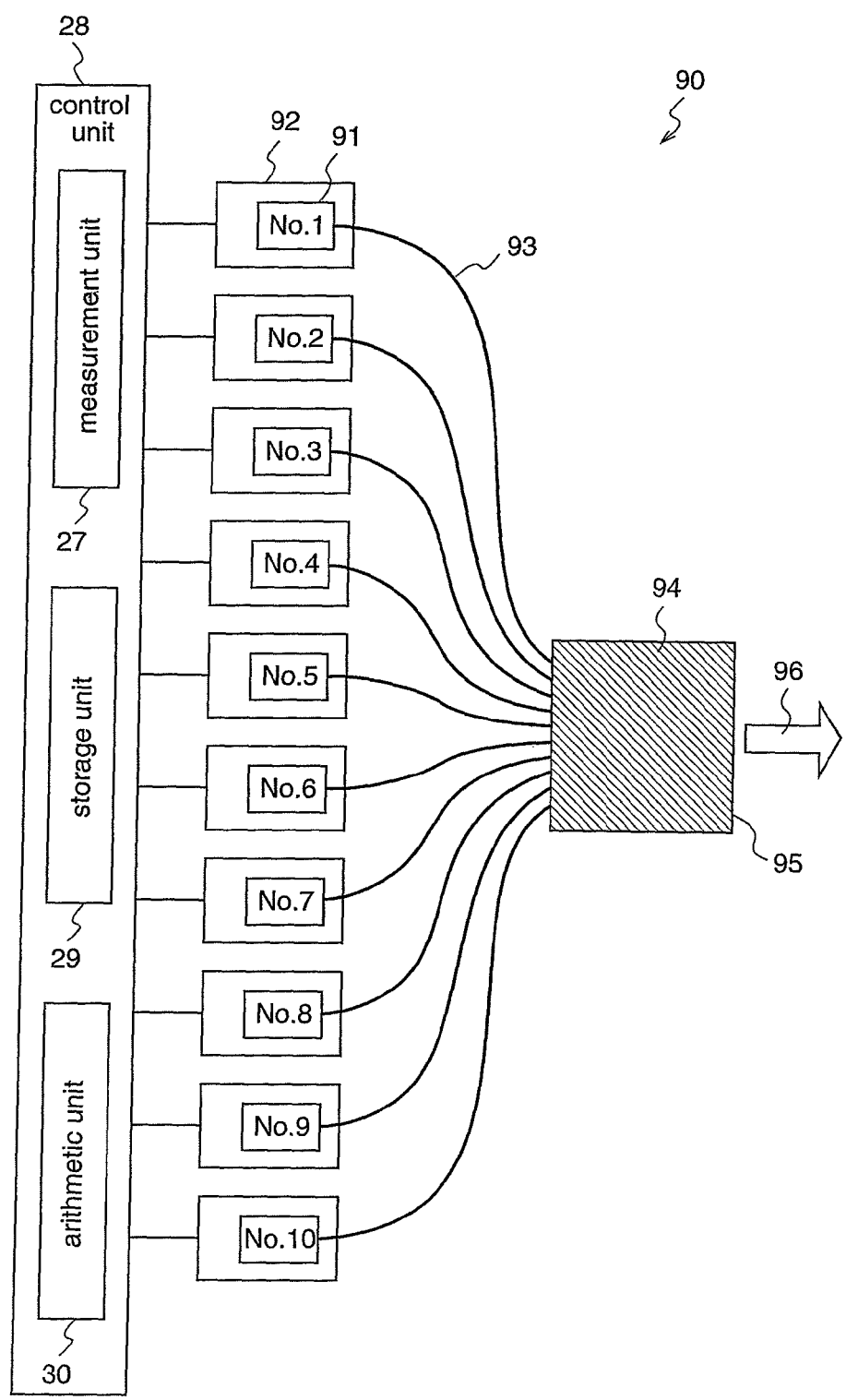
FIG. 5 is a schematic configuration diagram of a laser emission device according to a second embodiment of the present invention.

FIG. 5 is a diagram illustrating the configuration of a laser emission device 90 of this second embodiment. The laser emission device 90 is configured including a plurality of laser elements 91 similarly to the laser emission device 20 of the first embodiment shown in FIG. 1. In this second embodiment, it includes ten laser elements 91 from No.1 to No.10.

A description will be given of the case where the laser emission device 90 of FIG. 5 is composed of high-power red semiconductor lasers which are similar to those described for FIG. 1. Each of the high-power red semiconductor lasers used in FIG. 5 outputs a CW light, and its rated output power is 0.5W. The ten laser elements 91 are driven by corresponding ten laser driving power supplies 92, respectively. The light output powers and oscillation wavelengths of the respective laser elements 91 are monitored by light-receiving elements (not shown), and the operation current values and operation voltage values of the respective laser elements are monitored by the laser driving power supplies 92. Control for these data and the operation current values and the light output powers of the laser elements 91 is performed for each laser element 91 by a control unit 28. That is, also in this second embodiment, the control unit 28 includes a measurement unit 27, a storage unit 29, and an arithmetic unit 30 as in the first embodiment. The characteristic values of the laser elements 91 are measured by the measurement unit 27, stored in the storage unit 29 as needed, and subjected to arithmetic operation by the arithmetic unit 30 so as to be used as other performance indexes. Data and calculation formulae required for this arithmetic operation as well as data and calculation formulae required for the control have previously been stored as data in the storage unit 29 and the arithmetic unit 30.

Furthermore, red laser lights as output lights from the laser elements 91 are incident on ten optical fibers 93 whose one ends are disposed on the output facets of the respective laser elements 91. The red laser lights incident on the ten optical fibers 93 are applied to and multiplexed by an optical element 94 which uniformizes the light amount distribution, and thereby the light intensity is approximately uniformized, and thereafter, it is emitted as an output light 96 of the laser emission device 90 from the output facet 95 of the optical element 94. The optical element 94 comprises a hollow type rod integrator, and the optical fibers 93 are guided into the rod integrator and emit lights.

A description will be given of the case where a red laser light having a wavelength of 640 nm and a light output power of 4W is obtained from the laser emission device 90. A visual stimulus coefficient, a visual stimulus power and a visual stimulus efficiency which are performance indexes used at this time are defined by the following formulae (2) to (4). The larger these numerals are, the brighter the red color is seen for human eyes. Green and blue can be similarly defined.

$$\text{visual stimulus coefficient } X(\lambda) = -0.0181\lambda + 12.041 \quad (2)$$

where $\lambda$ is the oscillation wavelength of the laser element.

$$\text{visual stimulus power } R = X(\lambda) \times P(W) \quad (3)$$

where P is the light output power of the laser element.

$$\text{visual stimulus efficiency } R/\text{Win} \quad (4)$$

where Win is the operation power value of the laser element.

According to these definitions, for example, the light output power of 4W at the wavelength of 640 nm has the visual stimulus power R of 1.79W, and the visual stimulus efficiency is 0.60 assuming that the operation power value required to obtain this light output power is 3W. The operation power value of the laser emission device is a sum of the products obtained between the operation current values and the operation voltage values as the operation power values of the respective laser elements.

Table 1 shows the output powers, operation current values Iop, operation voltage values Vop, operation power values Win, oscillation wavelengths $\lambda$, visual stimulus coefficients X, and visual stimulus efficiencies R/Win of the red laser lights in the ten laser elements 91 in the laser emission device 90 shown in FIG. 5.

TABLE 1

(heatsink temperature: 25° C.)

| | output (W) | Iop (A) | Vop (V) | Win (W) | λ (nm) | x (λ) | R/Win |
|---|---|---|---|---|---|---|---|
| No. 1 | 0.5 | 1.31 | 2.20 | 2.89 | 639.6 | 0.459 | 0.080 |
| No. 2 | 0.5 | 1.36 | 2.28 | 3.09 | 639.7 | 0.457 | 0.074 |
| No. 3 | 0.5 | 1.34 | 2.22 | 2.98 | 639.3 | 0.464 | 0.078 |
| No. 4 | 0.5 | 1.31 | 2.17 | 2.83 | 639.8 | 0.455 | 0.081 |
| No. 5 | 0.5 | 1.34 | 2.21 | 2.97 | 639.9 | 0.453 | 0.076 |
| No. 6 | 0.5 | 1.37 | 2.10 | 2.88 | 637.1 | 0.504 | 0.087 |
| No. 7 | 0.5 | 1.35 | 2.26 | 3.05 | 640.3 | 0.446 | 0.073 |
| No. 8 | 0.5 | 1.34 | 2.11 | 2.84 | 636.8 | 0.509 | 0.090 |
| No. 9 | 0.5 | 1.44 | 2.13 | 3.06 | 636.2 | 0.520 | 0.085 |
| No. 10 | 0.5 | 1.33 | 2.10 | 2.80 | 636.7 | 0.511 | 0.091 |

Table 1 shows the list of the respective characteristic values of the laser elements 91 when the output power is 0.5W. When the visual stimulus power corresponding to the light output of 4W is evenly outputted from the ten laser elements 91 at the wavelength of 640 nm, the operation current values, the operation voltage values, and the operation power values have the characteristics values shown in Table 2. At this time, the total operation power value required for the ten laser elements 91 is 26.4W.

TABLE 2

| | output (W) | Iop (A) | Vop (V) | Win (W) |
|---|---|---|---|---|
| No. 1 | 0.375 | 1.18 | 2.18 | 2.57 |
| No. 2 | 0.375 | 1.22 | 2.25 | 2.75 |
| No. 3 | 0.375 | 1.20 | 2.19 | 2.64 |
| No. 4 | 0.375 | 1.18 | 2.14 | 2.52 |
| No. 5 | 0.375 | 1.21 | 2.18 | 2.64 |
| No. 6 | 0.375 | 1.26 | 2.08 | 2.62 |
| No. 7 | 0.375 | 1.22 | 2.23 | 2.72 |
| No. 8 | 0.375 | 1.23 | 2.09 | 2.57 |
| No. 9 | 0.375 | 1.32 | 2.11 | 2.79 |
| No. 10 | 0.375 | 1.23 | 2.08 | 2.55 |
| | | | total | 26.4 (W) |

Next, eight laser elements 91 are selected to be operated excluding the laser element 91 having the largest operation current value and the laser element 91 having the next largest operation current value. That is, in Table 1, the light output powers of the laser elements 91 of No.9 and No.6 are made 0W. Accordingly, the laser elements 91 to be operated are eight laser elements 91 other than No.9 and No.6 as shown in Table 3. In order to obtain the visual stimulus power corresponding to the light output power of 4W at the wavelength of 640 nm by these laser elements 91, the output power of one laser element 91 may be set to 0.477W as shown in Table 3.

TABLE 3

| | output (W) | Iop (A) | Vop (V) | Win (W) |
|---|---|---|---|---|
| No. 1 | 0.477 | 1.29 | 2.20 | 2.83 |
| No. 2 | 0.477 | 1.33 | 2.27 | 3.03 |
| No. 3 | 0.477 | 1.32 | 2.22 | 2.92 |
| No. 4 | 0.477 | 1.28 | 2.16 | 2.77 |
| No. 5 | 0.477 | 1.32 | 2.21 | 2.91 |
| No. 6 | 0 | 0.00 | 1.86 | 0.00 |
| No. 7 | 0.477 | 1.33 | 2.25 | 2.99 |
| No. 8 | 0.477 | 1.32 | 2.11 | 2.79 |
| No. 9 | 0 | 0.00 | 1.85 | 0.00 |
| No. 10 | 0.477 | 1.31 | 2.09 | 2.75 |
| | | | total | 23.0 (W) |

Since the operation power value required at this time is 23.0W, it is found that the operation power value can be reduced by more than 10% as compared with the case where the same light output power is obtained by the ten laser elements 91 shown in Table 2.

By the way, in the laser emission device 90 shown in FIG. 5, when the measurement unit 27 measures the output values of the laser lights with respect to the operation current values of the laser elements 91, it also measures the operation voltage values and the oscillation wavelengths of the laser elements 91. Then, the measurement unit 27 obtains the operation power values which are the products between the operation current values and the operation voltage values and the visual stimulus coefficients which are the functions of the oscillation wavelengths, and calculates the electricity-to-light efficiencies by dividing the light output values with the operation power values, and the visual stimulus powers which are the products between the visual stimulus coefficients and the light output values. Examples thereof are listed as the characteristic values on Table 1. After the characteristic values and the performance indexes are calculated as described above, the control unit 28 selects the numbers of the laser elements 91 to be used from among the plural laser elements 91 according to the operation power values or the visual stimulus efficiencies on Table 1 instead of the operation current values, and controls the laser driving power supplies 92 so as to operate only the selected laser elements 91. Further, in this second embodiment, the unselected laser elements become spare laser elements. The laser elements having relatively low visual stimulus efficiencies become spare laser elements on the basis of the measured values, and the spare laser elements are switched when the measured values are varied according to the usage status or the environmental variation.

Table 4 shows the characteristic values obtained when the laser elements 91 having relatively low operation power values are selected to be operated, excluding the laser element 91 having the largest operation power value and the laser element 91 having the next-largest operation power value, in order to obtain the same light output power as shown in Table 1. That is, only the laser elements 91 having relatively high electricity-to-light conversion efficiencies are selected to be operated.

TABLE 4

|  | output (W) | Iop (A) | Vop (V) | Win (W) |
|---|---|---|---|---|
| No. 1 | 0.471 | 1.28 | 2.20 | 2.81 |
| No. 2 | 0 | 0.00 | 0 | 0.00 |
| No. 3 | 0.471 | 1.31 | 2.22 | 2.90 |
| No. 4 | 0.471 | 1.28 | 2.16 | 2.76 |
| No. 5 | 0.471 | 1.31 | 2.21 | 2.89 |
| No. 6 | 0.471 | 1.35 | 2.09 | 2.82 |
| No. 7 | 0.471 | 1.32 | 2.25 | 2.97 |
| No. 8 | 0.471 | 1.32 | 2.11 | 2.78 |
| No. 9 | 0 | 0.00 | 0 | 0.00 |
| No. 10 | 0.471 | 1.31 | 2.09 | 2.74 |
|  |  |  | total | 22.7 (W) |

In Table 4, eight laser elements 91 are selected, and the visual stimulus power can be obtained at 22.7W while 26.4W and 23.0W are required in Table 2 and Table 3 to obtain the same visual stimulus power, respectively, and thus the laser emission device 90 can be operated with the lower power consumption.

Further, by using the laser elements having relatively high electricity-to-light conversion efficiencies considering the operation voltage values, the plural laser elements can be driven so as to increase the total electricity-to-light conversion efficiency of the laser emission device. By increasing the electricity-to-light conversion efficiency, the calorific power which causes not light but loss in the laser elements can be reduced. Although the lifetime of the laser element is shortened with an increase in temperature and a large calorific power of the laser element itself also leads to a reduction in its lifetime, such reduction in lifetime can be avoided. Further, although heat generation in the laser element also leads to a reduction in laser emission efficiency, such reduction in emission efficiency can be minimized.

Further, in the laser emission device 90 shown in FIG. 5, the measurement unit 27 calculates the visual stimulus powers which are the products between the visual stimulus coefficients as the performance indexes and the output power values of laser lights by using the arithmetic unit 30 and the storage unit 29 as well, and calculates the ratios of the visual stimulus powers to the operation power values as the visual stimulus efficiencies. Then, the control unit 28 selects the laser elements 91 to be used from among the plural laser elements 91 according to the visual stimulus efficiencies instead of the operation power values, and controls the laser driving power supplies 92 so as to operate only the selected laser elements 91. That is, eight laser elements 91 having relatively high visual stimulus efficiencies in Table 1 are selected as shown in Table 5.

TABLE 5

|  | output (W) | Iop (A) | Vop (V) | Win (W) |
|---|---|---|---|---|
| No. 1 | 0.462 | 1.27 | 2.19 | 2.79 |
| No. 2 | 0 | 0.00 | 0 | 0.00 |
| No. 3 | 0.462 | 1.30 | 2.21 | 2.88 |
| No. 4 | 0.462 | 1.27 | 2.16 | 2.73 |
| No. 5 | 0.462 | 1.30 | 2.20 | 2.87 |
| No. 6 | 0.462 | 1.34 | 2.09 | 2.80 |
| No. 7 | 0 | 0.00 | 0 | 0.00 |
| No. 8 | 0.462 | 1.31 | 2.11 | 2.76 |
| No. 9 | 0.462 | 1.40 | 2.12 | 2.98 |
| No. 10 | 0.462 | 1.30 | 2.09 | 2.72 |
|  |  |  | total | 22.5 (W) |

It is found from Table 5 that the laser emission device 90 is operated at the lower power consumption of 22.5W than any of the states shown in Tables 1 to 4. By using the visual stimulus efficiencies, the laser emission device can be operated in the state where the power consumption and the calorific power in the laser elements are most reduced while the stimulus to human beings is the same.

Further, instead of selecting the laser elements using the visual stimulus efficiencies, it is also preferable to select the laser elements 91 to be used using the visual stimulus powers and the operation current values without measuring the operation voltage values. Since it can be regarded as constant voltage driving when the laser driving power supplies are included, reduction in the power consumption of the image display device considering the visual stimulus can be realized including the laser driving power supplies.

Further, it is also possible to reduce the power consumption of the laser emission device 90 by measuring the characteristics of all the laser elements 91 with the measurement unit 28 every time the laser emission device 90 is operated, and performing selection of the laser element 91 as shown in Tables 1 to 4.

Further, it is also possible to achieve further reduction in power consumption by driving the laser elements 91 not by the CW operation but by the intermittent operation (intermittent operation by rectangle wave of On-duty: 92.5%, Off-duty: 7.5%) as shown in Table 6.

TABLE 6

|  | output (W) | Iop (A) | Vop (V) | Win (W) |
|---|---|---|---|---|
| No. 1 | 0.5 | 1.31 | 2.20 | 2.89 |
| No. 2 | 0 | 0.00 | 0 | 0.00 |
| No. 3 | 0.5 | 1.34 | 2.22 | 2.98 |
| No. 4 | 0.5 | 1.31 | 2.17 | 2.83 |
| No. 5 | 0.5 | 1.34 | 2.21 | 2.97 |
| No. 6 | 0.5 | 1.37 | 2.10 | 2.88 |
| No. 7 | 0 | 0.00 | 0 | 0.00 |
| No. 8 | 0.5 | 1.34 | 2.11 | 2.84 |
| No. 9 | 0.5 | 1.44 | 2.13 | 3.06 |
| No. 10 | 0.5 | 1.33 | 2.10 | 2.80 |
|  |  |  | total | 21.5 (W) | emission duty 92.5%

It is evident from Table 6 that the laser emission device 90 is operated at the power consumption of 21.5W which is lower than the power consumption of 22.5 shown in Table 5.

By driving the respective laser elements intermittently, the power consumption and the thermal burden on the laser elements are reduced, resulting in longer lifetime.

Further, when the laser elements 91 are operated with the output values between 1 time to 1.2 times of the rated output power of the laser light and only the laser elements 91 having relatively high visual stimulus efficiencies are selected to be operated, the same output power can be obtained by the seven laser elements 91 shown in Table 7, and thereby the laser emission device 90 can be operated at the lower power consumption of 20.7W.

TABLE 7

|  | output (W) | Iop (A) | Vop (V) | Win (W) |
|---|---|---|---|---|
| No. 1 | 0.524 | 1.33 | 2.21 | 2.95 |
| No. 2 | 0 | 0.00 | 0 | 0.00 |
| No. 3 | 0.524 | 1.37 | 2.23 | 3.05 |
| No. 4 | 0.524 | 1.33 | 2.17 | 2.89 |
| No. 5 | 0 | 0.00 | 0 | 0.00 |
| No. 6 | 0.524 | 1.40 | 2.10 | 2.93 |
| No. 7 | 0 | 0.00 | 0 | 0.00 |
| No. 8 | 0.524 | 1.37 | 2.12 | 2.89 |
| No. 9 | 0.524 | 1.46 | 2.13 | 3.11 |
| No. 10 | 0.524 | 1.36 | 2.10 | 2.85 |
|  |  |  | total | 20.7 (W) |

As described above, in the laser emission device of this second embodiment, since the plural laser elements are operated so that the laser elements have different light output powers or the laser elements to be operated are selected by using the operation current values or the operation power values, it is possible to realize a laser emission device having a high efficiency, a low power consumption, and a long lifetime. Further, since the visual stimulus coefficients are calculated from the oscillation wavelengths of the laser elements and used, the laser emission device can be operated with a higher efficiency, a lower power consumption, and a longer lifetime with the constant stimulus to human eyes which is required for the image display device. In addition, since the output lights have uniform intensity distributions at the output facets, the output lights can be applied as they are to the panel of the image display device, and thereby other optical elements can be dispensed with. Furthermore, since the laser emission device of this second embodiment is provided with the measurement unit for measuring the oscillation wavelengths of the laser elements, the laser elements can be controlled using the visual stimulus coefficients as described above, and even when the oscillation wavelengths are varied due to temperature or deterioration, such variations can be continually monitored.

When the oscillation wavelengths are not varied from the initial characteristics in the laser emission device of the second embodiment, the initial oscillation wavelengths are stored in the storage unit, and the visual stimulus powers may be calculated using the stored values without performing measurement of oscillation wavelengths.

Furthermore, when the laser emission device of this second embodiment is used as a laser light source for an image display device, the effects described in this second embodiment can be made more effective by designing the laser light source so as to have longer lifetime than any other major parts, i.e., by mounting many laser elements and selecting laser elements to be operated from among the many laser elements.

Furthermore, it is desired to configure the laser emission device of the second embodiment such that the measurement unit measures the operation current values or the operation power values of the laser elements which are operated with their output power values or visual stimulus powers being maintained at a constant value, and the control unit further includes the storage unit in which the measured values obtained by the measurement unit are stored for the respective laser elements, and the arithmetic operation unit which calculates the numerical variations of the measured values. Thereby, deterioration of the laser elements which give a constant light output power or a constant stimulus to human beings can be judged, and the laser elements can be operated with the light output power being varied, or appropriate laser elements can be selectively operated. Further, the output power of the laser emission device can be stabilized by not selecting a laser element having a rapid variation or a laser element having a large deterioration rate with time.

(Embodiment 3)

Next, the operation of the laser emission device 90 of the second embodiment in the case where it is used under a different ambient temperature will be described as a third embodiment with reference to Tables 8 to 10.

Table 8 shows the output powers, operation current values Iop, operation voltage values Vop, operation power values Win, oscillation wavelengths $\lambda$, visual stimulus coefficients X, and visual stimulus efficiencies R/Win of red laser lights outputted from ten laser elements 91 in the laser emission device 90, which are obtained when the heatsink temperature is 35° C. In contrast to Table 1, the oscillation wavelengths are shifted toward longer wavelengths, and the operation current values and the like are varied due to the temperature characteristics of the respective laser elements. In this third embodiment, it is possible to operate the laser elements with increasing the light output powers of the laser elements which are suited to the operating environment, or operate the laser elements without selecting the laser elements which are not suited to the operating environment, by continuously measuring the operation current values and the like by the measurement unit.

TABLE 8

(heatsink temperature: 35° C.)

|  | output (W) | Iop (A) | Vop (V) | Win (W) | $\lambda$ (nm) | x ($\lambda$) | R/Win |
|---|---|---|---|---|---|---|---|
| No. 1 | 0.5 | 1.50 | 2.22 | 3.32 | 641.9 | 0.417 | 0.063 |
| No. 2 | 0.5 | 1.49 | 2.29 | 3.41 | 642 | 0.415 | 0.061 |
| No. 3 | 0.5 | 1.52 | 2.24 | 3.39 | 641.6 | 0.423 | 0.062 |
| No. 4 | 0.5 | 1.37 | 2.18 | 2.99 | 642.1 | 0.413 | 0.069 |
| No. 5 | 0.5 | 1.52 | 2.23 | 3.37 | 642.2 | 0.412 | 0.061 |
| No. 6 | 0.5 | 1.71 | 2.12 | 3.63 | 639.7 | 0.457 | 0.063 |
| No. 7 | 0.5 | 1.49 | 2.27 | 3.37 | 642.6 | 0.404 | 0.060 |
| No. 8 | 0.5 | 1.75 | 2.14 | 3.74 | 639.4 | 0.462 | 0.062 |
| No. 9 | 0.5 | 1.85 | 2.16 | 3.98 | 638.8 | 0.473 | 0.059 |
| No. 10 | 0.5 | 1.89 | 2.14 | 4.04 | 639.3 | 0.464 | 0.057 |

When the visual stimulus power corresponding to the light output power of 4W is evenly outputted from the ten laser elements 91 at the wavelength of 640 nm, the characteristic values shown in Table 9 are obtained, and the required operation power value is 32.5W in total for the ten elements.

TABLE 9

| | output (W) | Iop (A) | Vop (V) | Win (W) |
|---|---|---|---|---|
| No. 1 | 0.413 | 1.40 | 2.20 | 3.07 |
| No. 2 | 0.413 | 1.42 | 2.27 | 3.22 |
| No. 3 | 0.413 | 1.41 | 2.21 | 3.12 |
| No. 4 | 0.413 | 1.27 | 2.16 | 2.75 |
| No. 5 | 0.413 | 1.41 | 2.20 | 3.11 |
| No. 6 | 0.413 | 1.60 | 2.11 | 3.38 |
| No. 7 | 0.413 | 1.43 | 2.25 | 3.21 |
| No. 8 | 0.413 | 1.64 | 2.12 | 3.48 |
| No. 9 | 0.413 | 1.74 | 2.14 | 3.71 |
| No. 10 | 0.413 | 1.65 | 2.11 | 3.49 |
| | | | total | 32.5 (W) |

In contrast, the light output power from the laser element having the lowest visual stimulus efficiency when the heatsink temperature becomes 35° C. is set to 0W, and the remaining nine laser elements are selectively operated, whereby Table 10 is obtained.

TABLE 10

| | output (W) | Iop (A) | Vop (V) | Win (W) |
|---|---|---|---|---|
| No. 1 | 0.462 | 1.45 | 2.21 | 3.21 |
| No. 2 | 0.462 | 1.44 | 2.28 | 3.29 |
| No. 3 | 0.462 | 1.47 | 2.23 | 3.27 |
| No. 4 | 0.462 | 1.33 | 2.17 | 2.88 |
| No. 5 | 0.462 | 1.47 | 2.22 | 3.26 |
| No. 6 | 0.462 | 1.66 | 2.12 | 3.52 |
| No. 7 | 0.462 | 1.45 | 2.26 | 3.26 |
| No. 8 | 0.462 | 1.70 | 2.13 | 3.63 |
| No. 9 | 0.462 | 1.80 | 2.15 | 3.86 |
| No. 10 | 0 | 0.00 | 0 | 0.00 |
| | | | total | 30.2 (W) |

The required operation power value is 30.2W in total for the nine elements, and thus reduction in power consumption is achieved relative to Table 9, and heat generation in the laser elements is suppressed. In Table 10, the laser element No.10 which is operated in Tables 3 to 7 is not operated because of its poor characteristics at high temperature, and the laser emission device is operated using only the laser elements which are suited to the operation environment.

When the operation environment temperature is varied, the characteristics of the laser elements are varied as shown in Table 1 and Table 8. In order to control the characteristic variations of the laser elements, the measurement unit in the laser emission device is desired to measure the laser element temperatures in this third embodiment. The laser element temperatures may be the temperatures of the mount parts or the heatsink parts which support the laser elements. Although the laser element temperatures may be measured element by element, it is desirable that the plural laser elements are fixed to the same heatsink, and the temperature of this heatsink is measured to obtain the laser element temperatures. The number of temperature measurement points can be reduced by fixing the plural laser elements to the same heatsink.

Further, the oscillation wavelength shifts of the laser elements can be calculated from the laser element temperatures measured by the measurement unit. Since the oscillation wavelength shift amounts of the laser elements can be approximated in linear relation with the laser element temperatures, the oscillation wavelength shift amounts can be calculated from the laser element temperatures. By using the oscillation wavelength shift amounts, the visual stimulus coefficients of the present invention can be calculated, and thereby the laser elements can be operated so as to have different light output powers. In this case, it is not necessary to monitor the oscillation wavelengths.

In the laser emission device of this third embodiment, the measurement unit measures the output power values and the operation current values or the operation power values with respect to the laser element temperatures, and the measured output values and operation current values or operation power values with respect to the laser element temperatures are stored in the storage unit in the control unit. When the laser emission device is started up, the control unit performs control using the stored values so as to make the light output powers of the respective laser elements different from each other, and determines the operation current values of the laser elements using the stored values.

It is possible to select the laser elements to be operated or instantly determine the operation current values by measuring the laser element temperatures at the start-up of the laser emission device. Especially when the operation current values are significantly varied depending on the laser element temperatures, the laser elements can be prevented from being deteriorated due to excessive operation current values, and the output power at the start-up can be stabilized in short time.

In the laser emission device of this third embodiment, it is more preferable to measure or calculate the oscillation wavelengths with respect to the laser element temperatures, obtain the visual stimulus powers from the output values with respect to the laser element temperatures, replace the previous output values stored in the storage unit with the measured output values, and operate the laser elements using the stored values when the laser emission device is started up. Thereby, the constant visual stimulus power which is required for the image display device can be instantly outputted when it is started up, and the laser elements are prevented from being deteriorated.

Further, the output values or the visual stimulus powers with respect to the laser element temperatures may be obtained by measuring the total light from the laser elements to be operated. More preferably, the output values or the visual stimulus powers are measured and stored in the storage unit for each laser element. Thereby, the optimum laser elements with respect to the laser element temperatures can be selected at the start-up, and the laser elements to be operated can be switched when the laser element temperatures are varied. Further, estimated lifetimes of the respective laser elements can be calculated from the temperature characteristics of the laser elements. Using the estimated lifetimes, the laser elements having relatively long estimated lifetimes are selectively operated, and thereby increase in the lifetime of the laser emission device can be achieved.

As described above, in the laser emission device of this third embodiment, the output values and the operation current values or the operation power values in response to the laser element temperatures are measured, the measured output values and operation current values or operation power values are stored in the storage unit in the control unit, and when the laser emission device is started up, the respective laser elements are controlled so as to have different light output powers by using the stored values, and the operation current values of the laser elements are determined using the stored values. Therefore, the plural laser elements can be controlled in response to the temperature variations to operate the laser elements at a high efficiency, a low power consumption, and a long lifetime, and further, control for the laser emission device at start-up can be instantly performed.

(Embodiment 4)

Next, a laser emission device according to a fourth embodiment of the present invention will be described.

Figure 6:
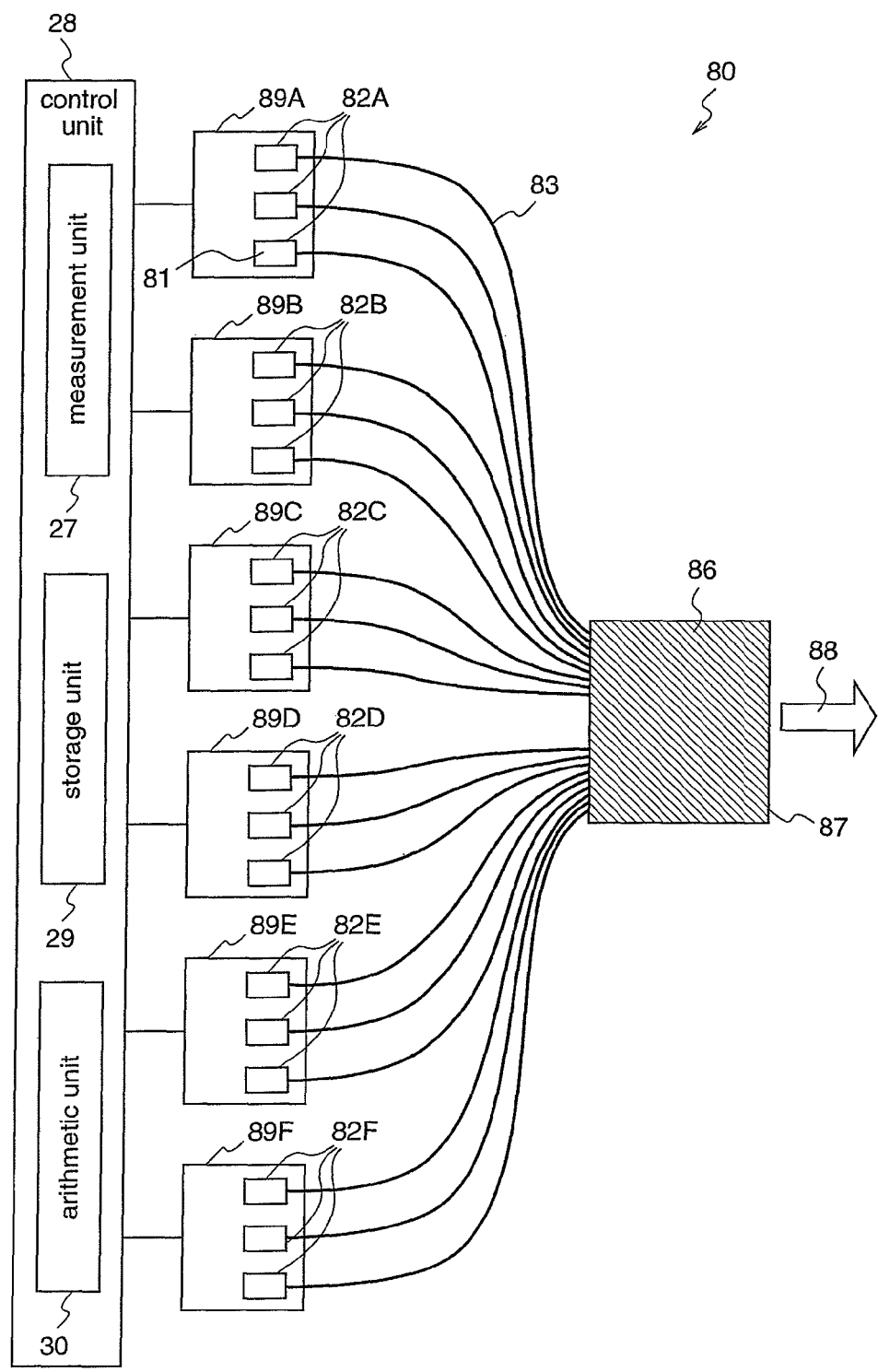
FIG. 6 is a schematic configuration diagram of a laser emission device according to a fourth embodiment of the present invention.

FIG. 6 is a diagram illustrating the configuration of a laser emission device 80 of the fourth embodiment. The laser emission device 80 is different from the laser emission device 20 of the first embodiment shown in FIG. 1 in that the laser light sources of the laser emission device 80 are configured by six laser arrays 82A, 82B, 82C, 82D, 82E, and 82F each comprising three laser elements 81.

The laser emission device 80 shown in FIG. 6 will be described for the case where each laser element 81 is implemented by, for example, the high-power red semiconductor laser described with respect to FIG. 1. Accordingly, the high-power red semiconductor laser has a center wavelength of 638 nm and a rated light output power of 500 mW as a continuous output. At this time, the layer arrays 82A, 82B, 82C, 82D, 82E, and 82F are driven by the corresponding laser driving power supplies 89A, 89B, 89C, 89D, 89E, and 89F, respectively. The light output power of each laser array is monitored for each laser array by a light-receiving element (not shown), and control for the data, the operation current value and the light output power of the laser array is performed for each laser array by the control unit 28.

Figures 7, 8:
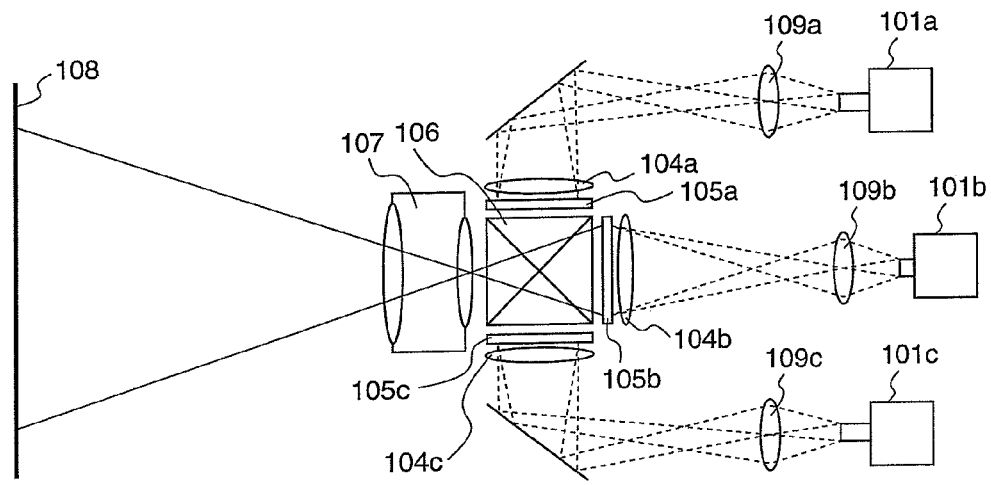
FIG. 7 is a table showing the characteristics of plural laser arrays which are used in the laser emission device of the fourth embodiment.
FIG. 8 is a schematic configuration diagram of an image display device using the laser emission device of the present invention as a laser light source, according to an eleventh embodiment of the present invention.

A description will be given of the case where an output light of 7.5W is obtained by the entire laser emission device 80 by using these red lasers. In this case, since there are six laser arrays, each laser array is made to output a light of 1.5W, and the operation current values IopLA of the respective laser arrays are measured by the measurement unit 27 as shown in FIG. 7. Five laser arrays having the relatively small operation current values IopLA are selected according to the measured values shown in FIG. 7, and only the selected laser arrays are driven by the laser driving power supplies 89, whereby the laser emission device 80 is operated with a light output power of 7.5W. That is, the laser arrays 82C, 82B, 82A, 82F, and 82D are selected. The laser array 82E having the maximum operation current value IopLA is not selected.

In FIG. 6, the selected laser arrays 82C, 82B, 82A, 82F, and 82D emit lights from the respective laser elements 81, and the red laser lights are incident on optical fibers 83 whose one ends are arranged at the output facets of the respective laser elements. The red laser lights which enter the optical fibers 83 are guided to the uniformization optical element 86 through the optical fibers 83, and the light intensities of the red laser lights are approximately uniformized at the output facet 87 of the optical element 86 to be outputted as an output light 88.

Thereby, the laser emission element 80 can be operated at low current consumption and low power consumption. Also when the laser emission device 80 is operated next, the operation current values IopAL are similarly measured as shown in FIG. 7, the laser arrays having relatively low operation current values are selected, and only the selected laser arrays are operated. Thereby, the laser emission device 80 can be always operated using only the laser arrays having the relatively low operation currents.

In the laser emission device of this fourth embodiment, the relations between the operation current values of the plural laser element arrays and the output values of the laser lights with respect to the operation current values is measured, and at least one laser element array among the plural laser element arrays is operated so that the at least one laser element has its light output power that is different from those of other laser element arrays, based on the measured relations between the operation current values of the plural laser element arrays and the output values of the laser lights with respect to the operation current values. Therefore, the laser emission device can be operated with increased ratios of the output powers from the laser elements having relatively high emission efficiencies with a constant light output power and a constant light amount distribution, thereby realizing a low power consumption operation.

(Embodiment 5)

Next, a laser emission device according to a fifth embodiment of the present invention, which corresponds to Claims 14, 15, 18, 19, 20, and 22 will be described.

Figure 11:
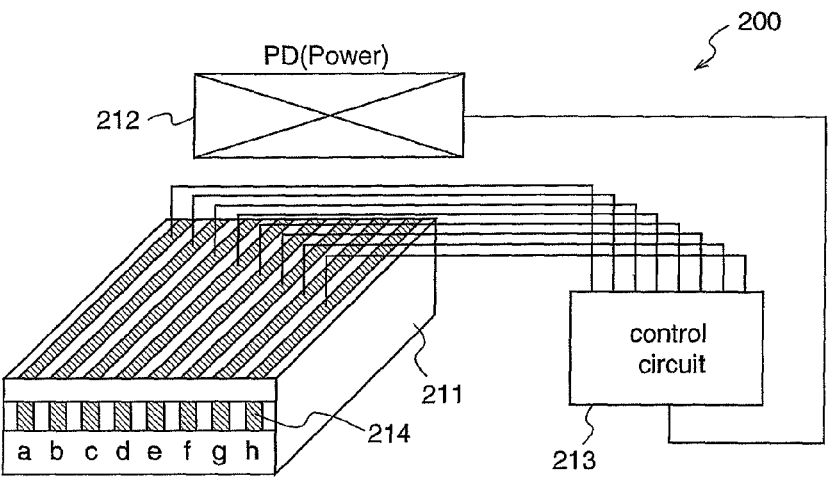
FIG. 11 is a schematic configuration diagram of a laser emission device according to a fifth embodiment of the present invention.

FIG. 11 is a schematic diagram illustrating a configuration of a laser emission device 200 according to a fifth embodiment of the present invention. In this fifth embodiment, a blue laser light source will be described. The laser emission device 200 of this fifth embodiment adopts a high output power GaN series multistripe semiconductor laser 211 in order to realize a high-luminance laser display. When obtaining a high power as a total light amount by using plural laser elements, the light source is increased in size when a plurality of separated semiconductor lasers are used. However, when a multistripe semiconductor laser is used, the size of the light source can be miniaturized because it can be configured by a single semiconductor chip. In this fifth embodiment, the number of multistripes is eight ((a) to (h)) as shown in FIG. 11, and current is usually injected into seven laser elements to make them emit lights. No light is emitted from the remaining one laser element while the current is injected into the seven laser elements to make them emit lights. As shown in FIG. 11, electrodes for supplying drive currents are disposed on the respective laser element stripes 214 of the semiconductor laser, and the drive current values are controlled by a control circuit 213. Further, a photodetector (PD) 212 is disposed at one of the emission facets of the semiconductor laser chip 211 (facet opposite to the image formation side), and the photodetector 212 detects the amounts of beam lights from the respective laser element stripes 214 to feedback them to the control circuit 213.

Figure 12:
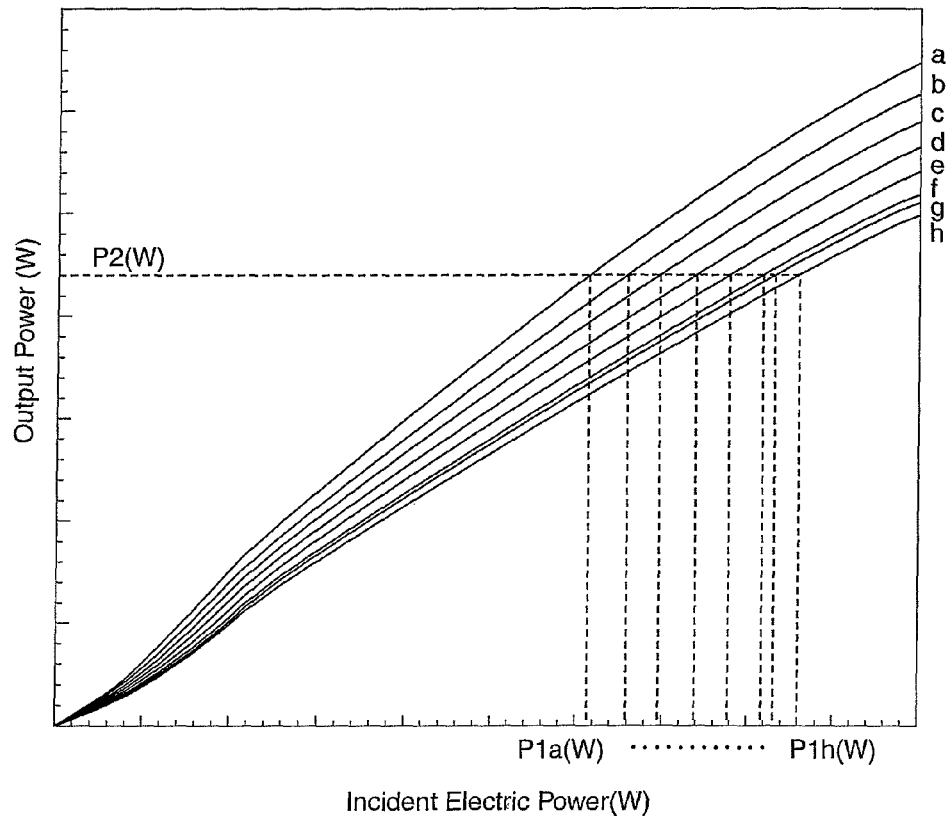
FIG. 12 is a diagram for explaining the relation between the operation power and the laser light output value according to the fifth embodiment.

A description will be given of the selection method for the laser elements to emit lights, and the emission method. Initially, in order to check the emission efficiencies of the eight laser elements, current is injected into the respective laser elements to make them perform laser emission. As the result, the relation between the operation power value P1(W) and the laser light output value P2(W) as shown in FIG. 12 is obtained. The emission efficiency required to obtain the laser light output value P2(W) in each of the eight laser elements a to h of this fifth embodiment is calculated as an electricity-to-light conversion efficiency by dividing the output value P2(W) by the operation power value P1(W). For example, it is calculated from P2(W)/P1a(W) for the laser element a.

Since P1a<P1b< . . . <P1h in FIG. 12, the eight laser elements are a, b, c, d, e, f, g, h in descending order of emission efficiency. Based on this, the seven laser elements (a, b, c, d, e, f, g) having relatively high emission efficiencies are made to emit lights at the output value P2(W), and controlled by the automatic power control (APC) operation. With respect to the laser element h having the lowest emission efficiency, if any other laser element which is emitting light is deteriorated or reduced in its emission efficiency with time and thereby the emission efficiency thereof becomes lower than that of the laser element h, usage of the laser element whose emission efficiency becomes lower than that of the laser element h is stopped, and the laser element h is used instead.

As described above, in the laser emission device of this fifth embodiment, the emission efficiencies are previously calculated, and seven laser elements are selected in descending order of emission efficiency and made to emit lights, whereby a high-luminance image can be obtained for a long period while continuously maintaining low power consumption. Further, since the laser elements of relatively high emission efficiencies are selected, heat generation in the laser elements can be minimized, and thereby reduction in the calorific power can be realized.

While in this fifth embodiment the laser light source having eight laser elements is used and one of the laser elements is made to emit no light, i.e., used as a spare laser element, plural semiconductor lasers may be made to emit no light. Also in this case, low power consumption can be achieved by selecting the laser elements in descending order of emission efficiency and making them emit lights as in this fifth embodiment.

Further, while in this fifth embodiment the emission efficiencies of the respective laser elements are calculated and the laser elements to be operated are selected immediately before the laser emission device is used, the calculation of the emission efficiencies of the laser elements may be performed when the device is manufactured. Further, the processes of calculating the emission efficiencies of the laser elements and selecting the laser elements to emit lights may be arbitrarily performed while the laser emission device is used. By performing the calculation of the emission efficiencies for every predetermined period or at random while using the laser emission device, even when the emission efficiency of a light-emitting laser element becomes lower than that of the spare laser element due to reduction in the emission efficiency which is caused by long-term or short-term deterioration of the laser element, the deteriorated laser element can be rapidly found to be replaced with the spare laser element, thereby realizing a low power consumption and a long lifetime for the laser emission device or the image display device using this laser emission device.

Further, while in this fifth embodiment the multistripe semiconductor laser fabricated on a single semiconductor substrate is used as the semiconductor laser, a semiconductor laser comprising plural semiconductor chips or an array of semiconductor lasers such as facet-emission lasers may be used. In the semiconductor laser comprising plural semiconductor chips, influence of heat generation due to light emission can be reduced to suppress temperature rise by separating the light emitting points of the semiconductor chips from each other.

While in this fifth embodiment the total output power obtained from the seven laser elements is constant, the total light amount may be decreased when one or some laser elements among the eight laser elements become lower than a set emission efficiency value. In this case, when the laser emission device is used as each of light sources of three colors R, G, B for the image display device, the white balance of the image display device is disrupted if the total light amount of one of the laser emission devices is reduced. Therefore, when decreasing the total light amount of one laser emission device, in order to keep the white balance, the output powers of the laser emission devices used as the light sources of other colors should also be reduced to make the power ratios uniform.

While in this fifth embodiment one laser element among the eight laser elements is not made to emit light to be used as a spare laser element, if brightness of image is emphasized in a high-luminance mode when the laser emission device of this fifth embodiment is used as a light source for an image display device, all the eight laser elements may be made to emit lights.

Furthermore, while in this fifth embodiment the plural laser elements are blue lasers, it is possible to perform similar control also when the plural laser elements are red lasers or green lasers.

(Embodiment 6)

Next, a laser emission device according to a sixth embodiment of the present invention which corresponds to Claims 14, 16, 18, 19, 20, and 22 will be described.

Figure 13:
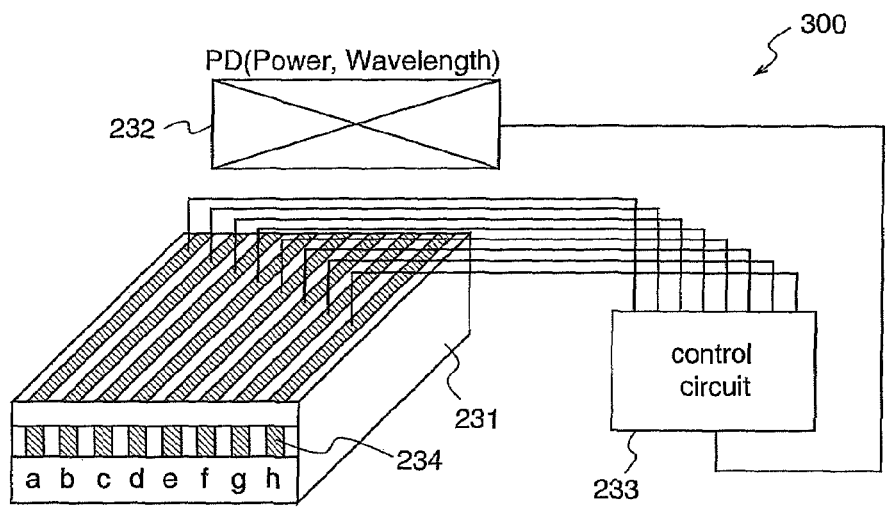
FIG. 13 is a schematic configuration diagram of a laser emission device according to a sixth embodiment of the present invention.

FIG. 13 is a schematic diagram illustrating a configuration of a laser emission device 300 according to a sixth embodiment of the present invention. In this sixth embodiment, a blue laser light source will be described. The laser emission device 300 of this sixth embodiment adopts a high output power GaN series multistripe semiconductor laser 231 to realize a high-luminance laser display. When obtaining a high power as a total light amount by using plural laser elements, the light source is increased in size when a plurality of separated semiconductor lasers are used. However, when a multistripe semiconductor laser is used, the size of the light source can be miniaturized because it can be configured by a single semiconductor chip. In this sixth embodiment, the number of multistripes is eight ((a) to (h)) as shown in FIG. 13, and current is usually injected into seven laser elements to make them emit lights. The remaining one laser element is made to emit no light while the current is injected into the seven laser elements to make them emit lights. As shown in FIG. 13, electrodes for flowing drive currents are disposed on the respective laser element stripes 234 of the semiconductor laser, and the drive current values are controlled by a control circuit 233. Further, a photodetector (PD) 232 is disposed at one of the emission facets of the semiconductor laser chip 231 (facet opposite to the image formation side), and the photodetector 232 detects the amounts of beam lights from the respective laser element stripes 234 to feedback them to the control circuit 233.

A description will be given of the method for selecting the laser elements to emit lights, and the emission method. Initially, in order to check the emission efficiencies of the eight laser elements, current is injected into the respective laser elements to make them perform laser emission. As the result, the relation between the operation power value P1(W) and the laser light output value P2(W) as shown in FIG. 12 is obtained. The emission efficiency which is required to obtain the laser light output value P2(W) in each of the eight laser elements of this sixth embodiment is calculated as a visual stimulus efficiency by dividing the visual stimulus power that is the product between the visual stimulus coefficient α and the output value P2(W) by the operation power value P1(W). For example, it is calculated from αa×P2(W)/P1a(W) for the laser element a.

Figure 14:
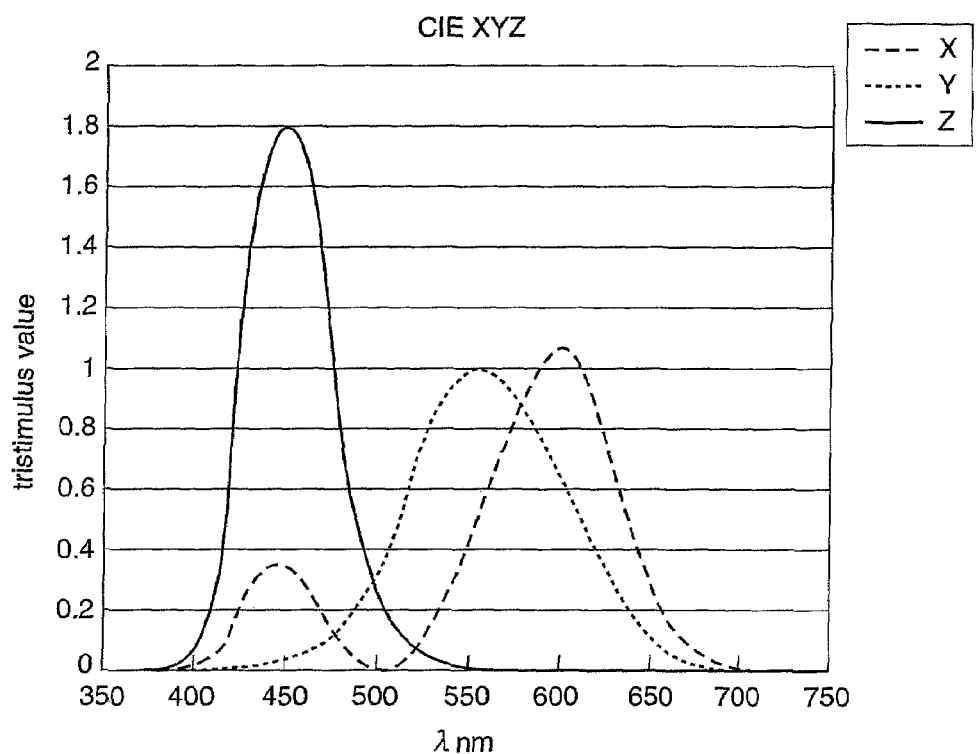
FIG. 14 is a diagram for explaining the relation between the wavelength and the tristimulus value.

The visual stimulus coefficient α is a parameter with which human beings recognize a color, and the emission efficiency including the color stimulus value can be calculated by multiplying the output value P2(W) with the visual stimulus coefficient α. FIG. 14 shows the tristimulus curves for determining the visual stimulus coefficients α. The visual stimulus coefficients α of the three colors R, G, B are indicated by the curves of X, Y, Z shown in FIG. 14, respectively, and have wavelength dependencies. In this sixth embodiment, the visual stimulus coefficient α of the blue laser light source is determined by the curve Z, and the blue laser light source have the maximum value of the visual stimulus coefficient α in the vicinity of the wavelength of 450 nm as shown in FIG. 14. That is, the emission coefficients of the laser elements are calculated according to the visual stimulus coefficients α which are obtained from the result of FIG. 12 and the wavelength measurement. In this embodiment, the laser elements are a, b, c, d, e, f, g, h in descending order of emission efficiency. Then, seven laser elements (a, b, c, d, e, f, g) having relatively high emission efficiencies are selectively made to emit lights, and controlled by the automatic power control (APC) operation. With respect to the laser element h having the lowest emission efficiency, if any other laser element which is emitting light is deteriorated or reduced in its emission efficiency with time and thereby the emission efficiency thereof becomes lower than that of the laser element h, usage of the laser element whose emission efficiency becomes lower than that of the laser element h is stopped, and the laser element h is used instead.

As described above, in the laser emission device of this sixth embodiment, the seven laser elements are selected in descending order of emission efficiency and made to emit lights with considering the color control of the image formation device by taking the color visual stimulus coefficients into the emission efficiencies, whereby a high-luminance image can be obtained for a long period while continuously maintaining low power consumption. Further, since the laser elements of relatively high emission efficiencies are selected, heat generation in the laser elements can be minimized, thereby realizing reduction in the calorific power.

While in this sixth embodiment the laser light source having eight laser elements is used and one of the laser elements is made to emit no light, i.e., used as a spare laser element, plural semiconductor lasers may be made to emit no light. Also in this case, low power consumption can be achieved by selecting the laser elements in descending order of emission efficiency and making them emit lights as in this sixth embodiment.

Further, while in this sixth embodiment the emission efficiencies of the respective laser elements are calculated and the laser elements to be operated are selected immediately before the laser emission device is used, the calculation of the emission efficiencies of the laser elements may be performed when the device is manufactured. Further, the processes of calculating the emission efficiencies of the laser elements and selecting the laser elements to emit lights may be arbitrarily performed while the laser emission device is used. By performing the calculation of the emission efficiencies for every predetermined period or at random while using the laser emission device, even when the emission efficiency of a light-emitting laser element becomes lower than that of the spare laser element due to reduction in the emission efficiency which is caused by long-term or short-term deterioration of the laser element, the deteriorated laser element can be rapidly found to be replaced with the spare laser element, thereby realizing a low power consumption and a long lifetime for the laser emission device or the image display device using this laser emission device.

Further, while in this sixth embodiment the multistripe semiconductor laser fabricated on a single semiconductor substrate is used as the semiconductor laser, a semiconductor laser comprising plural semiconductor chips or an array of semiconductor lasers such as facet-emission lasers may be used. In the semiconductor laser comprising plural semiconductor chips, influence of heat generation due to light emission can be reduced to suppress temperature rise by separating the light emitting points of the semiconductor chips from each other.

While in this sixth embodiment the total output power obtained from the seven laser elements is constant, the total light amount may be decreased when one or some laser elements among the eight laser elements become lower than a set emission efficiency value. In this case, when the laser emission device is used as each of light sources of three colors R, G, B for the image display device, the white balance of the image display device is disrupted if the total light amount of one of the laser emission devices is reduced. Therefore, when decreasing the total light amount of one laser emission device, in order to keep the white balance, the output powers of the laser emission devices used as the light sources of other colors should also be reduced to make the power ratios uniform.

While in this sixth embodiment one laser element among the eight laser elements is not made to emit light to be used as a spare laser element, if brightness of image is emphasized in a high-luminance mode when the laser emission device of this embodiment is used as a light source for an image display device, all the eight laser elements may be made to emit lights.

Furthermore, while in this sixth embodiment the plural laser elements are blue lasers, it is possible to perform similar control also when the plural laser elements are red lasers or green lasers.

(Embodiment 7)

Next, a laser emission device according to a seventh embodiment of the present invention which corresponds to Claims 14, 17, 18, 19, 20, and 24 will be described.

Since the configuration of the laser emission device of this seventh embodiment is identical to that of the laser emission device 200 of the fifth embodiment shown in FIG. 11, the configuration of the laser emission device of this seventh embodiment will be described with reference to FIG. 11.

In this fifth embodiment, a blue laser light source will be described. The laser emission device of this seventh embodiment adopts a high output power GaN series multistripe semiconductor laser 211 in order to realize a high-luminance laser display. When obtaining a high power as a total light amount by using plural laser elements, the light source is increased in size when a plurality of separated semiconductor lasers are used. However, when a multistripe semiconductor laser is used, the size of the light source can be miniaturized because it can be configured by a single semiconductor chip. In this seventh embodiment, the number of multistripes is eight ((a) to (h)) as shown in FIG. 11, and current is usually injected into seven laser elements to make them emit lights. The remaining one laser element is made to emit no light while the current is injected into the seven laser elements to make them emit lights. As shown in FIG. 11, electrodes for flowing drive currents are disposed on the respective laser element stripes 214 of the semiconductor laser, and the drive current values are controlled by a control circuit 213. Further, a photodetector (PD) 212 is disposed at one of the emission facets of the semiconductor laser chip 211 (facet opposite to the image formation side), and the photodetector 212 detects the amounts of beam lights from the respective laser element stripes 214 to feedback them to the control circuit 213.

Figure 15:
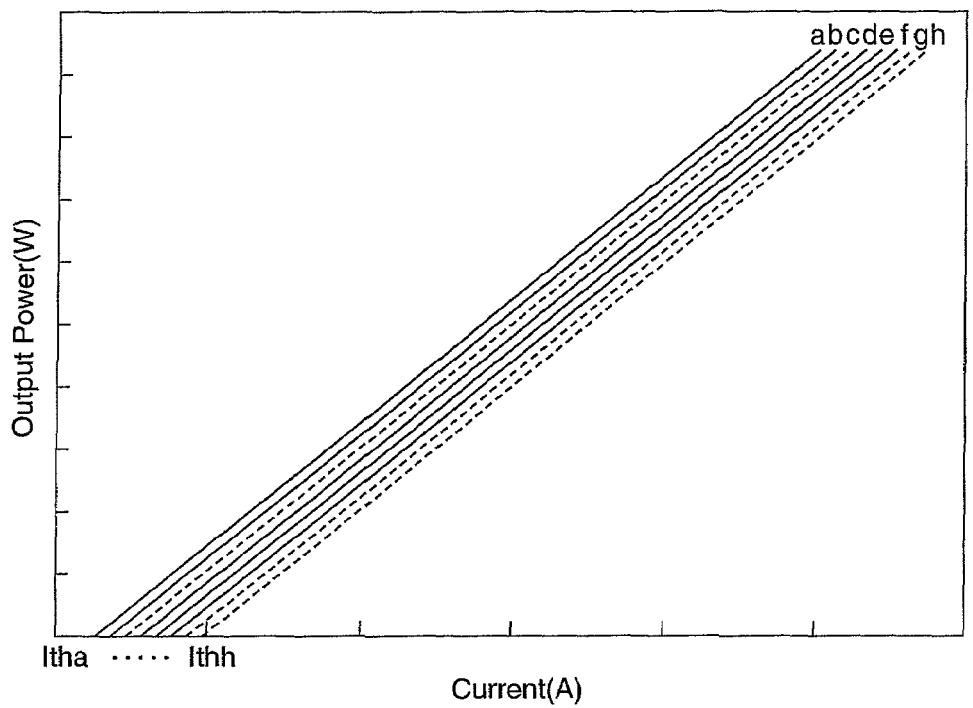
FIG. 15 is a diagram for explaining the relation between the driving current value and the laser light output value according to the sixth embodiment.
Figure 16:
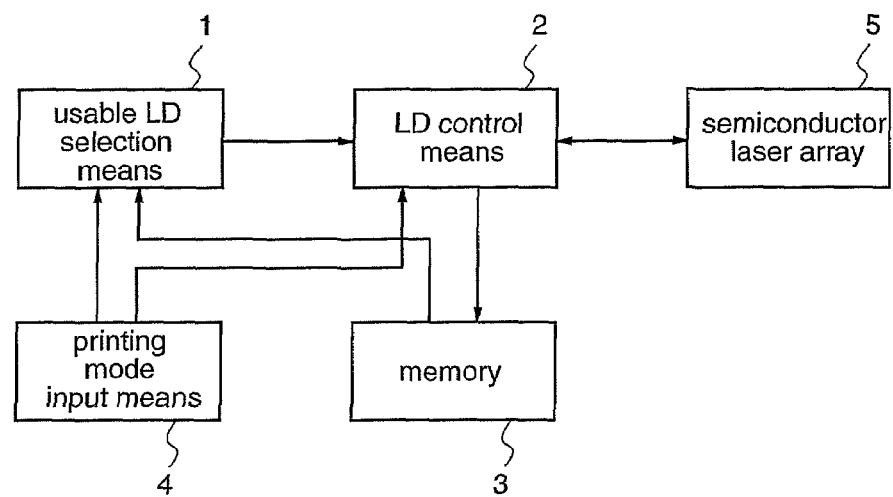
FIG. 16 is a block diagram illustrating a functional configuration of a beam scanning device as an example of a conventional laser emission device.

A description will be given of the method for selecting the laser elements to emit lights, and the emission method. Initially, in order to check the oscillation threshold values of the eight laser elements, current is injected into the respective laser elements to make them emit lights. As the result, the relation between the driving current and the light output power as shown in FIG. 15 is obtained. The oscillation threshold value of the laser element a among the eight laser elements of this seventh embodiment is Itha. Since Itha< Ithab< . . . <Ithh from FIG. 15, the eight laser elements are a, b, c, d, e, f, g, h in ascending order of oscillation threshold value. Then, the seven laser elements (a, b, c, d, e, f, g) having relatively low oscillation threshold values are made to emit lights, and controlled by the automatic power control (APC) operation. With respect to the laser element h having the highest oscillation threshold value, if any other laser element which is emitting light is deteriorated or increased in its oscillation threshold value with time and thereby the oscillation threshold value thereof becomes higher than that of the laser element h, usage of the laser element whose oscillation threshold value becomes higher than that of the laser element h is stopped, and the laser element h is used instead.

As described above, in the laser emission device of this seventh embodiment, the oscillation threshold values are previously calculated, and seven laser elements are selected in ascending order of oscillation threshold value and made to emit lights, whereby a high-luminance image can be obtained for a long period while continuously maintaining low power consumption. Further, since the laser elements of low oscillation threshold values are selected, heat generation from the laser elements can be minimized, thereby realizing reduction in the calorific power. Further, since the laser elements of relatively low oscillation threshold values are selected to make them emit lights, long lifetimes of the laser elements can be realized.

While in this seventh embodiment the laser light source having eight laser elements is used and one of the laser elements is made to emit no light, i.e., used as a spare laser element, plural semiconductor lasers may be made to emit no light. Also in this case, low power consumption can be achieved by selecting the laser elements in ascending order of oscillation threshold value and making them emit lights as in this sixth embodiment.

Further, while in this seventh embodiment the oscillation threshold values of the respective laser elements are calculated and the laser elements to be operated are selected immediately before the laser emission device is used, the calculation of the oscillation threshold values of the laser elements may be performed when the device is manufactured. Further, the processes of calculating the oscillation threshold values of the laser elements and selecting the laser elements to emit lights may be arbitrarily performed while the laser emission device is used. By performing the calculation of the oscillation threshold values for every predetermined period or at random while using the laser emission device, even when the oscillation threshold value of a light-emitting laser element becomes lower than that of the spare laser element due to increase in the oscillation threshold value which is caused by long-term or short-term deterioration of the laser element, the deteriorated laser element can be rapidly found to be replaced with the spare laser element, thereby realizing a low power consumption and a long lifetime for the laser emission device or the image display device using this laser emission device. Further, further deterioration and local heat generation in the laser element can be minimized by detecting increase in the threshold value during the light emission.

Further, in this seventh embodiment, all the slope efficiencies of the respective laser elements are the same as shown in FIG. 15, and low power consumption and reduced heat generation are realized by selecting the laser elements in ascending order of oscillation threshold value to make them emit lights. However, when the slope efficiencies of the respective laser elements are not the same, the laser elements should be selected according to the power to be emitted and the both characteristics of the oscillation threshold values and the slope efficiencies, thereby achieving low power consumption and reduced heat generation.

Further, while in this seventh embodiment the multistripe semiconductor laser fabricated on a single semiconductor substrate is used as the semiconductor laser, a semiconductor laser comprising plural semiconductor chips or an array of semiconductor lasers such as facet-emission lasers may be used. In the semiconductor laser comprising plural semiconductor chips, influence of heat generation due to light emission can be reduced to suppress temperature rise by separating the light emitting points of the semiconductor chips from each other.

While in this seventh embodiment the total output power obtained from the seven laser elements is constant, the total light amount may be decreased when one or some laser elements among the eight laser elements become lower than a set oscillation threshold value. In this case, when the laser emission device is used as each of light sources of three colors R, G, B for the image display device, the white balance of the image display device is disrupted if the total light amount of one of the laser emission devices is reduced. Therefore, when decreasing the total light amount of one laser emission device, in order to keep the white balance, the output powers of the laser emission devices used as the light sources of other colors should also be reduced to make the power ratios uniform.

While in this seventh embodiment one laser element among the eight laser elements is not made to emit light to be used as a spare laser element, if brightness of image is emphasized in a high-luminance mode when the laser emission device of this embodiment is used as a light source for an image display device, all the eight laser elements may be made to emit lights.

Furthermore, while in this seventh embodiment the plural laser elements are blue lasers, it is possible to perform similar control also when the plural laser elements are red lasers or green lasers.

(Embodiment 8)

Next, a laser emission device according to an eighth embodiment of the present invention which corresponds to Claims 14, 15, 18, 19, 20, 21 and 22 will be described.

Since the configuration of the laser emission device of this eighth embodiment is identical to that of the laser emission device 200 of the fifth embodiment shown in FIG. 11, the configuration of the laser emission device of this eighth embodiment will be described with reference to FIG. 11.

In this eighth embodiment, a blue laser light source will be described. The laser emission device of this eighth embodiment adopts a high output power GaN series multistripe semiconductor laser 211 in order to realize a high-luminance laser display. When obtaining a high power as a total light amount by using plural laser elements, the light source is increased in size when a plurality of separated semiconductor lasers are used. However, when a multistripe semiconductor laser is used, the size of the light source can be miniaturized because it can be configured by a single semiconductor chip. In this eighth embodiment, the number of multistripes are eight ((a) to (h)) as shown in FIG. 11, and current is usually injected into seven laser elements to make them emit lights. The remaining one laser element is made to emit no light while the current is injected into the seven laser elements to make them emit lights. As shown in FIG. 11, electrodes for flowing drive currents are disposed on the respective laser element stripes 214 of the semiconductor laser, and the drive current values are controlled by a control circuit 213. Further, a photodetector (PD) 212 is disposed at one of the emission facets of the semiconductor laser chip 211 (facet opposite to the image formation side), and the photodetector 212 detects the amounts of beam lights from the respective laser element stripes 214 to feedback them to the control circuit 213.

In the method for selecting laser elements to emit lights according to this eighth embodiment, similarly to the fifth embodiment, the emission efficiencies (electricity-to-light conversion efficiencies are measured, laser elements to emit lights are determined in descending order of emission efficiency while the laser element of the lowest emission efficiency is made to emit no light, and when some light-emitting laser element is deteriorated and its emission efficiency becomes lower than the laser element which emits no light, the deteriorated laser element is replaced with the laser element which emits no light.

In this eighth embodiment, the relations between the operation power values and the laser light output value as shown in FIG. 12 is obtained as in the fifth embodiment. Since P1a<P1b<...<P1h in FIG. 12, the eight laser elements are a, b, c, d, e, f, g, h in descending order of emission efficiency. Then, seven laser elements (a, b, c, d, e, f, g) having relatively high emission efficiencies are selected and made to emit lights. While in the fifth embodiment the respective laser elements emit lights with the same output value P2(W), in this eighth embodiment the laser elements emit lights with rates being given to the emission output powers in descending order of emission efficiency. That is, the same operating power is applied to the respective laser elements so that the total light amount becomes 7×P2(W). Thereby, the emitted light amounts of the respective laser elements are varied while the same power is applied thereto. The laser element having the highest emission efficiency has the largest output value. The total light amount 7×P2(W) is controlled by the automatic power control (APC) operation. With respect to the laser element h having the lowest emission efficiency, if any other laser element which is emitting light is deteriorated or reduced in its emission efficiency with time and thereby the emission efficiency thereof becomes lower than that of the laser element h, usage of the laser element whose emission efficiency becomes lower than that of the laser element h is stopped, and the laser element h is used instead.

As described above, in the laser emission device of this eighth embodiment, the emission efficiencies are calculated in advance, and the seven laser elements are selected in descending order of emission efficiency and made to emit lights, whereby high-luminance images can be obtained over a long period while continuously maintaining low power consumption. Further, since the laser elements of high emission efficiencies are selected, heat generation in the laser elements can be minimized, thereby realizing reduction in the calorific power. Further, since the laser element having the higher emission efficiency emits light so that the light output power thereof becomes larger, the burden on the laser element having the lower emission efficiency can be reduced, and thereby the lifetimes of all the laser elements can be increased, resulting in a long-life laser emission device or a long-life image display device using this laser emission device.

While in this eighth embodiment the laser light source having eight laser elements is used and one of the laser elements is made to emit no light, i.e., used as a spare laser element, plural semiconductor lasers may be made to emit no light. Also in this case, low power consumption can be achieved by selecting the laser elements in descending order of emission efficiency and making them emit lights as in this sixth embodiment.

Further, while in this eighth embodiment the emission efficiencies of the respective laser elements are calculated and the laser elements to be operated are selected immediately before the laser emission device is used, the calculation of the emission efficiencies of the laser elements may be performed when the device is manufactured. Further, the processes of calculating the emission efficiencies of the laser elements and selecting the laser elements to emit lights may be arbitrarily performed while the laser emission device is used. By performing the calculation of the emission efficiencies for every predetermined period or at random while using the laser emission device, even when the emission efficiency of a light-emitting laser element becomes lower than that of the spare laser element due to reduction in the emission efficiency which is caused by long-term or short-term deterioration of the laser element, the deteriorated laser element can be rapidly found to be replaced with the spare laser element, thereby realizing a low power consumption and a long lifetime for the laser emission device or the image display device using this laser emission device.

Further, while in this eighth embodiment the multistripe semiconductor laser fabricated on a single semiconductor substrate is used as the semiconductor laser, a semiconductor laser comprising plural semiconductor chips or an array of semiconductor lasers such as facet-emission lasers may be used. In the semiconductor laser comprising plural semiconductor chips, influence of heat generation due to light emission can be reduced to suppress temperature rise by separating the light emitting points of the semiconductor chips from each other.

While in this eighth embodiment the total output power obtained from the seven laser elements is constant, the total light amount may be decreased when one or some laser elements among the eight laser elements become lower than a set emission efficiency value. In this case, when the laser emission device is used as each of light sources of three colors R, G, B for the image display device, the white balance of the image display device is disrupted if the total light amount of one of the laser emission devices is reduced. Therefore, when decreasing the total light amount of one laser emission device, in order to keep the white balance, the output powers of the laser emission devices used as the light sources of other colors should also be reduced to make the power ratios uniform.

While in this eighth embodiment one laser element among the eight laser elements is not made to emit light to be used as a spare laser element, if brightness of image is emphasized in a high-luminance mode when the laser emission device of this embodiment is used as a light source for an image display device, all the eight laser elements may be made to emit lights.

Furthermore, while in this eighth embodiment the plural laser elements are blue lasers, it is possible to perform similar control also when the plural laser elements are red lasers or green lasers.

(Embodiment 9)

Next, a laser emission device according to a ninth embodiment of the present invention which corresponds to Claims 14, 16, 18, 19, 20, 21 and 22 will be described.

Since the configuration of the laser emission device of this ninth embodiment is identical to that of the laser emission device 300 of the sixth embodiment shown in FIG. 13, the configuration of the laser emission device of this ninth embodiment will be described with reference to FIG. 13.

In this ninth embodiment, a blue laser light source will be described. The laser emission device of this ninth embodiment adopts a high output power GaN series multistripe semiconductor laser 231 in order to realize a high-luminance laser display. When obtaining a high power as a total light amount by using plural laser elements, the light source is increased in size when a plurality of separated semiconductor lasers are used. However, when a multistripe semiconductor laser is used, the size of the light source can be miniaturized because it can be configured by a single semiconductor chip. In this ninth embodiment, the number of multistripes is eight ((a) to (h)) as shown in FIG. 13, and current is usually injected into seven laser elements to make them emit lights. The remaining one laser element is made to emit no light while the current is injected into the seven laser elements to make them emit lights. As shown in FIG. 13, electrodes for flowing drive currents are disposed on the respective laser element stripes 234 of the semiconductor laser, and the drive current values are controlled by a control circuit 233. Further, a photodetector (PD) 232 is disposed at one of the emission facets of the semiconductor laser chip 231 (facet opposite to the image formation side), and the photodetector 232 detects the beam light amounts from the respective laser element stripes 234 and the wavelengths thereof to feedback them to the control circuit 213.

Since the method for selecting the laser elements to emit lights is identical to that described for the sixth embodiment, repeated description is not necessary. The relations between the operation power values and the laser light output value, and the measured wavelengths are identical to those of the sixth embodiment. As the result, the eighth laser elements are a, b, c, d, e, f, g, and h in descending order of emission efficiency considering the visual stimulus coefficients, and seven laser elements (a, b, c, d, e, f, g) having relatively high emission efficiencies are selected and made to emit lights. While in the sixth embodiment the respective laser elements emit lights at the same output value P2(W), in this ninth embodiment the laser elements emit lights with rates being given to the emission output powers in descending order of emission efficiency. That is, the same operating power is applied to the respective laser elements so that the total light amount becomes 7×P2(W). Thereby, the emitted light amounts of the respective laser elements are varied while the same power is applied to the laser elements. The laser element having the highest emission efficiency has the largest output value. The total light amount 7×P2(W) is controlled by the automatic power control (APC) operation. With respect to the laser element h having the lowest emission efficiency, if any other laser element which is emitting light is deteriorated or reduced in its emission efficiency with time and thereby the emission efficiency thereof becomes lower than that of the laser element h, usage of the laser element whose emission efficiency becomes lower than that of the laser element h is stopped, and the laser element h is used instead.

As described above, in the laser emission device of this ninth embodiment, the emission efficiencies are calculated in advance, and the seven laser elements are selected in descending order of emission efficiency and made to emit lights, whereby a high-luminance image can be obtained over a long period while continuously maintaining low power consumption. Further, since the laser elements of relatively high emission efficiencies are selected, heat generation in the laser elements can be minimized, thereby realizing reduction in the calorific power. Further, since the laser element having the higher emission efficiency emits light so that the light output power thereof becomes larger, the burden on the laser element having the lower emission efficiency can be reduced, and thereby the lifetimes of all the laser elements can be increased, resulting in a long-life laser emission device or a long-life image display device using this laser emission device.

Further, in this ninth embodiment, by taking the color visual stimulus coefficients into the emission efficiencies, the seven laser elements are selected in descending order of emission efficiency with considering the color control of the image display device which uses the laser emission device as a light source, whereby a high-luminance image can be obtained over a long period while continuously maintaining low power consumption. Further, since the laser elements of relatively high emission efficiencies are selected, heat generation in the laser elements can be minimized, thereby realizing reduction in the calorific power.

While in this ninth embodiment the laser light source having eight laser elements is used and one of the laser elements is made to emit no light, i.e., used as a spare laser element, plural semiconductor lasers may be made to emit no light. Also in this case, low power consumption can be achieved by selecting the laser elements in descending order of emission efficiency and making them emit lights as in this ninth embodiment.

Further, while in this ninth embodiment the emission efficiencies of the respective laser elements are calculated and the laser elements to be operated are selected immediately before the laser emission device is used, the calculation of the emission efficiencies of the laser elements may be performed when the device is manufactured. Further, the processes of calculating the emission efficiencies of the laser elements and selecting the laser elements to emit lights may be arbitrarily performed while the laser emission device is used. By performing the calculation of the emission efficiencies for every predetermined period or at random while using the laser emission device, even when the emission efficiency of a light-emitting laser element becomes lower than that of the spare laser element due to reduction in the emission efficiency which is caused by long-term or short-term deterioration of the laser element, the deteriorated laser element can be rapidly found to be replaced with the spare laser element, thereby realizing a low power consumption and a long lifetime for the laser emission device or the image display device using this laser emission device.

Further, while in this ninth embodiment the multistripe semiconductor laser fabricated on a single semiconductor substrate is used as the semiconductor laser, a semiconductor laser comprising plural semiconductor chips or an array of semiconductor lasers such as facet-emission lasers may be used. In the semiconductor laser comprising plural semiconductor chips, influence of heat generation due to light emission can be reduced to suppress temperature rise by separating the light emitting points of the semiconductor chips from each other.

While in this ninth embodiment the total output power obtained from the seven laser elements is constant, the total light amount may be decreased when one or some laser elements among the eight laser elements become lower than a set emission efficiency value. In this case, when the laser emission device is used as each of light sources of three colors R, G, B for the image display device, the white balance of the image display device is disrupted if the total light amount of one of the laser emission devices is reduced. Therefore, when decreasing the total light amount of one laser emission device, in order to keep the white balance, the output powers of the laser emission devices used as the light sources of other colors should also be reduced to make the power ratios uniform.

While in this ninth embodiment one laser element among the eight laser elements is not made to emit light to be used as a spare laser element, if brightness of image is emphasized in a high-luminance mode when the laser emission device of this embodiment is used as a light source for an image display device, all the eight laser elements may be made to emit lights.

Furthermore, while in this ninth embodiment the plural laser elements are blue lasers, it is possible to perform similar control also when the plural laser elements are red lasers or green lasers.

(Embodiment 10)

Next, a laser emission device according to a tenth embodiment of the present invention which corresponds to Claims 14, 17, 18, 19, 20, 23, and 24 will be described.

Since the configuration of the laser emission device of this tenth embodiment is identical to that of the laser emission device 200 of the fifth embodiment shown in FIG. 11, the configuration of the laser emission device of this tenth embodiment will be described with reference to FIG. 11.

In this tenth embodiment, a blue laser light source will be described. The laser emission device of this tenth embodiment adopts a high output power GaN series multistripe semiconductor laser 211 in order to realize a high-luminance laser display. When obtaining a high power as a total light amount by using plural laser elements, the light source is increased in size when a plurality of separated semiconductor lasers are used. However, when a multistripe semiconductor laser is used, the size of the light source can be miniaturized because it can be configured by a single semiconductor chip. In this tenth embodiment, the number of multistripes is eight ((a) to (h)) as shown in FIG. 11, and current is usually injected into seven laser elements to make them emit lights. The remaining one laser element is made to emit no light while the current is injected into the seven laser elements to make them emit lights. As shown in FIG. 11, electrodes for flowing drive currents are disposed on the respective laser element stripes 214 of the semiconductor laser, and the drive current values are controlled by a control circuit 213. Further, a photodetector (PD) 212 is disposed at one of the emission facets of the semiconductor laser chip 211 (facet opposite to the image formation side), and the photodetector 212 detects the amounts of beam lights from the respective laser element stripes 214 to feedback them to the control circuit 213.

Since the method for selecting the laser elements to emit lights according to this tenth embodiment is identical to that of the seventh embodiment, repeated description is not necessary. The current vs light output characteristics of the laser elements are identical to those of the seventh embodiment, and the eight laser elements are denoted by a, b, c, d, e, f, g, h in ascending order of oscillation threshold value. Therefore, the seven laser elements (a, b, c, d, e, f, g) are selected and made to emit lights. While in the seventh embodiment the respective laser elements emit lights with the same output power value P2(W), in this tenth embodiment the laser elements emit lights with rates being given to the emission output powers in ascending order of oscillation threshold value. That is, the respective laser elements are made to emit lights with the same operation power so that the total light amount becomes 7×P2(W). Thereby, the emission output powers of the respective laser elements are varied while the same power is applied to the laser elements. The total light amount 7×P2(W) is controlled by the automatic power control (APC) operation. Further, with respect to the laser element h having the highest oscillation threshold value, if any other laser element which is emitting light is deteriorated or increased in its oscillation threshold value with time and thereby the oscillation threshold value thereof becomes higher than that of the laser element h, usage of the laser element whose oscillation threshold value becomes higher than that of the laser element h is stopped, and the laser element h is used instead.

As described above, in the laser emission device of this ninth embodiment, the oscillation threshold values are previously calculated according to the relation between the driving current and the light output power, and seven laser elements are selected in ascending order of oscillation threshold value and made to emit lights, whereby a high-luminance image can be obtained over a long period while continuously maintaining low power consumption. Further, since the laser elements of relatively low oscillation threshold values are selected, heat generation in the laser elements can be minimized, thereby realizing reduction in the calorific power. Furthermore, since the laser element of lower oscillation threshold value is oscillated so as to have larger light output power, burden on the laser element having higher oscillation threshold value can be reduced, and thereby the lifetimes of all the laser elements can be increased. As the result, it is possible to realize a long-life laser device or a long-life image display device using this laser device.

While in this tenth embodiment the laser light source having eight laser elements is used and one of the laser elements is made to emit no light, i.e., used as a spare laser element, plural semiconductor lasers may be made to emit no light. Also in this case, low power consumption can be achieved by selecting the laser elements in ascending order of oscillation threshold value and making them emit lights as in this tenth embodiment.

Further, while in this tenth embodiment the oscillation threshold values of the respective laser elements are calculated and the laser elements to be operated are selected immediately before the laser emission device is used, the calculation of the oscillation threshold values of the laser elements may be performed when the device is manufactured. Further, the processes of calculating the oscillation threshold values of the laser elements and selecting the laser elements to emit lights may be arbitrarily performed while the laser emission device is used. By performing the calculation of the oscillation threshold values for every predetermined period or at random while using the laser emission device, even when the oscillation threshold value of a light-emitting laser element becomes lower than that of the spare laser element due to increase in the oscillation threshold value which is caused by long-term or short-term deterioration of the laser element, the deteriorated laser element can be rapidly found to be replaced with the spare laser element, thereby realizing a low power consumption and a long lifetime of the laser emission device or the image display device using this laser emission device. Further, further deterioration and local heat generation in the laser element can be minimized by detecting increase in the threshold value during the light emission.

Further, while in this tenth embodiment the multistripe semiconductor laser fabricated on a single semiconductor substrate is used as the semiconductor laser, a semiconductor laser comprising plural semiconductor chips or an array of semiconductor lasers such as facet-emission lasers may be used. In the semiconductor laser comprising plural semiconductor chips, influence of heat generation due to light emission can be reduced to suppress temperature rise by separating the light emitting points of the semiconductor chips from each other.

While in this tenth embodiment the total output power obtained from the seven laser elements is constant, the total light amount may be decreased when one or some laser elements among the eight laser elements become lower than a set oscillation threshold value. In this case, when the laser emission device is used as each of light sources of three colors R, G, B for the image display device, the white balance of the image display device is disrupted if the total light amount of one of the laser emission devices is reduced. Therefore, when decreasing the total light amount of one laser emission device, in order to keep the white balance, the output powers of the laser emission devices used as the light sources of other colors should also be reduced to make the power ratios uniform.

While in this tenth embodiment one laser element among the eight laser elements is not made to emit light to be used as a spare laser element, if brightness of image is emphasized in a high-luminance mode when the laser emission device of this embodiment is used as a light source for an image display device, all the eight laser elements may be made to emit lights.

Furthermore, while in this tenth embodiment the plural laser elements are blue lasers, it is possible to perform similar control also when the plural laser elements are red lasers or green lasers.

(Embodiment 11)

FIG. 8 shows, as an eleventh embodiment of the present invention, an example of configuration of a laser display (two-dimensional image display device) to which the laser emission device according to any of the first to tenth embodiments described above is applied. Three laser emission devices 101a, 101b, and 101c comprising three-color laser elements of red(R), green(G), and blue(B), respectively, are used as light sources. An AlGaInP/GaAs series semiconductor laser having a wavelength of 638 nm is used as the red laser emission device 101a, and a GaN series semiconductor laser having a wavelength of 445 nm is used as the blue laser emission device 101c. On the other hand, a laser including a wavelength conversion element which halves the wavelength of an infrared semiconductor laser is used as the green laser emission device 101b. The laser beams emitted from the laser emission devices 101a, 101b, and 101c have the light amount distributions suited to the image display device by uniformization optical elements in the laser emission devices, respectively. The laser beams are expanded and projected by relay lenses 109a, 109b, and 109c to be included on spatial modulation elements 105a, 105b, and 105c, respectively. Reference numerals 104a, 104b, and 104c denote field lenses. The laser lights modulated by the spatial modulation elements 105 are multiplexed by a dichroic prism 106 to form a color image. Thus obtained image is projected onto a screen 108 by a projection lens 107. In this embodiment, the outputs from the plural laser elements are synthesized by the uniformization optical element to increase the wavelength spectrum of the laser light emitted from the laser oscillation device, and thereby the coherency can be eased, and further, speckle noise can be reduced as a light source.

It is preferable to provide the laser emission device with a fluctuating fiber, or diffusion plate, or lens array. The fluctuating diffusion plate or lens array temporally varies the angle of the laser beam, thereby to remove speckle noise. It is preferable to configure the laser emission device such that a fiber fluctuating mechanism is provided on the optical fiber up to the uniformization optical element, or a fluctuating mechanism for the diffusion plate or the lens array is provided in a stage prior to incident of the laser light onto the uniformization optical element. Further, it is also preferable to fluctuate the uniformization optical element.

The three-color laser emission devices are desired to measure the operation current values or the visual stimulus efficiencies which give a constant visual stimulus power. Thereby, the white color is adjusted so as to reduce the power consumption of the three-color laser light sources, resulting in a reduction in the power consumption of the image display device. Further, when the visual stimulus efficiency of the laser emission device of a certain color is deteriorated exceeding a predetermined range, the color temperature of the image display device is controlled to reduce the necessary visual stimulus power from the deteriorated laser emission device. Thereby, the output power from the deteriorated laser emission device is reduced, and further deterioration of the laser emission device can be avoided, resulting in an increase in the lifetime of the image display device. It is not necessary to measure the visual stimulus efficiencies or the like in all the three-color laser emission devices, but only the laser emission device of the color which is most likely to deteriorate may measure the visual stimulus efficiency or the like.

In the image display device of this eleventh embodiment, the laser emission element described in any of the first to tenth embodiment is used as the light sources of R, G, B three colors, and the laser elements or laser array elements are selected to be operated so as to realize a low power consumption and a long lifetime from among the laser elements or laser array elements mounted on each laser emission device, thereby realizing a low-power-consumption and long-life image display device.

While in this eleventh embodiment the front projection type two-dimensional image display device is described, a configuration which projects light from the rear of the screen (rear projection display) is also available.

Further, while in FIG. 8 the transparent type spatial modulation element comprising a liquid crystal element is used, a reflection type modulation element may be used. Further, the present invention is also applicable to a scan type image display device which, having a scanning mirror, sequentially scans the image to display the same.

(Embodiment 12)

Figure 9A:
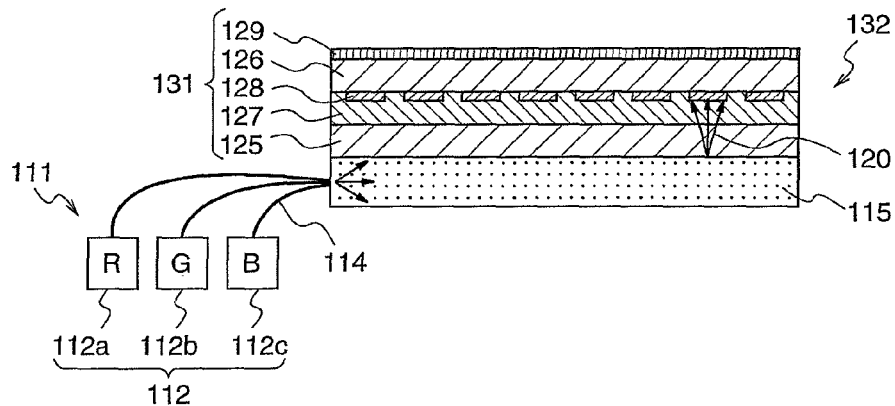
FIG. 9 is a schematic configuration diagram of an image display device using the laser emission device of the present invention as a laser light source, according to a twelfth embodiment of the present invention.
Figure 9B:
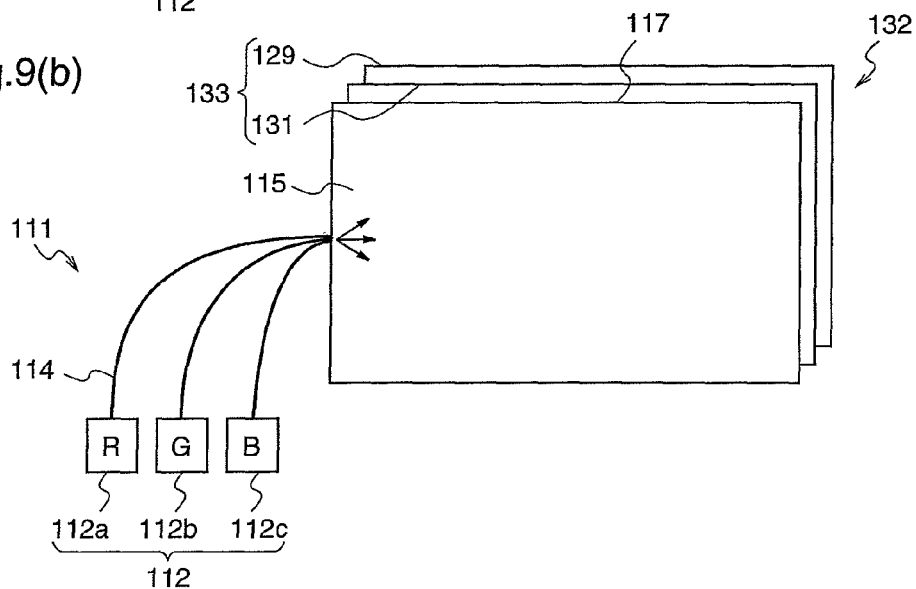

FIG. 9 is a schematic diagram illustrating the configuration of an image display device according to a twelfth embodiment of the present invention, which adopts any of the laser emission devices of the first to tenth embodiments as laser light sources. For example, FIG. 9 shows a schematic diagram of a liquid crystal display device as an image display device, wherein FIG. 9(a) is a schematic cross-sectional view and FIG. 9(b) is a schematic configuration diagram viewed from the rear surface of the liquid crystal display device.

The liquid crystal display device 132 is configured by a planar illuminating device 111 comprising a laser emission device having a laser light source unit 112 and a light guide plate type uniformization optical element 115, and a liquid crystal plate 131 and a polarization plate 129 which perform image display utilizing laser lights 120 emitted from the planar illuminating device 111. More specifically, as shown in FIG. 12(b), the liquid crystal display device 132 uses, as a back light illuminating device, the planar illuminating device 111 which comprises the laser emission device having the laser light source unit and the light guide plate type uniformization optical element 115, and further, it includes a liquid crystal display panel 133 having the polarization plate 129 and the liquid crystal plate 131 which is provided at the display surface side. The liquid crystal display panel 133 comprises the liquid crystal plate 131 and the polarization plate 129.

The laser light source unit 112 comprises a laser light source 112a having a plurality of red laser elements, a laser light source 112b having a plurality of green laser elements, and a laser light source 112c having a plurality of blue laser elements.

The laser lights emitted from the plural laser elements in the laser light source unit 112 are guided through optical fibers, and enter the light guide plate type uniformization optical element 114 through a bundle fiber 114. The incident laser light from the bundle fiber is applied toward the liquid crystal display panel so as to have a planar and uniform light amount distribution that is preferable to be used in the image display device. In this twelfth embodiment, the three-color laser elements use the same uniformization optical element. In this configuration, the number of uniformization optical elements can be decreased, and the light amount distributions of the three-color lasers can be made uniform.

While an incident side polarization plate disposed in a stage prior to incident of the laser light into the liquid crystal plate 131 is not shown in FIG. 9, such polarization plate may be used. Alternatively, a hologram element may be used as the uniformization optical element 115 so as to emit only one-side polarized light from the planar illuminating device. The laser light 120 is transmitted through a liquid crystal 120 and pixels 128 which are sandwiched by glass plates 125 and 126, and then transmitted through the polarization plate 129 to be displayed as an image.

In this twelfth embodiment, the planar illuminating device 111 in the image display device is configured using one of the laser emission devices according to the first to tenth embodiments as a light source, and the plural laser elements are operated so as to have different light output powers or only the laser elements having relatively low operation current values or operation power values are selectively operated, thereby realizing a low-power-consumption and long-life image display device having a low-current-consumption, low-power-consumption, and long-life light source.

Figure 10:
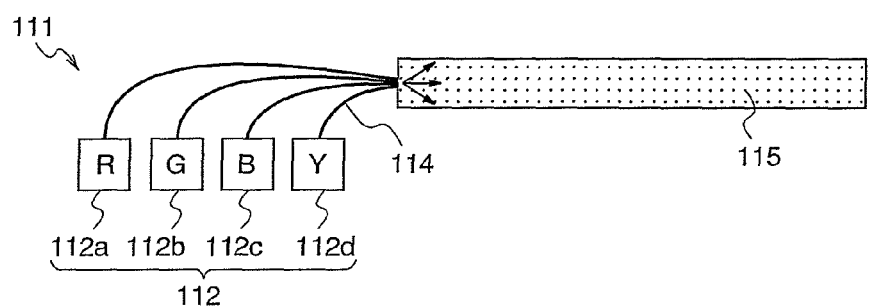
FIG. 10 is a schematic configuration diagram of another example of a laser emission device used in the image display device of the twelfth embodiment.

FIG. 10 shows the case where the laser light source unit 112 has laser light sources of four colors, i.e., it has a yellow laser light source 112d in addition to the red laser light source 112a, the green laser light source 112b, and the blue laser light source 112c. In this embodiment, the light output powers from the four-color laser light sources are controlled according to the visual stimulus efficiencies or the operation current values which give a constant visual stimulus power, thereby to determine the distribution of the light output powers of the four colors. In the case of using the three-color laser light sources, when the image display device displays colors of a constant luminance and a constant chrominance, the required light output powers of the laser light sources of the respective colors are uniquely determined. However, when using the four-color laser light sources, the light output powers are not uniquely determined, but the output ratios of the four-color laser light sources can be selected from various values. In this embodiment, the output ratios of the four-color laser light sources are determined from the visual stimulus efficiencies. By increasing the output power of the color having higher visual stimulus efficiency, the visual stimulus efficiency of the image display device is increased, thereby realizing reduction in the power consumption of the image display device. The present invention can be applied to the image display device having the four-color laser light sources by using the laser emission device which measures the visual stimulus power. Also when using laser light sources of more than four colors, the output ratios thereof can be controlled using the visual stimulus efficiencies. The oscillation wavelength at which the visual stimulus power is calculated may be measured or calculated according to the laser element temperature, or it may be stored as the initial characteristics in the storage unit of the laser emission device.

The light guide plate type uniformization optical element 115 of this embodiment may be formed of a resin material which is transparent and has excellent optical characteristics and formability. Especially it is preferable to use an acrylic resin or polyolefin resin having less birefringence, and it may be configured having a reflection plane and a hollow part.

As described above, in the image display device of this twelfth embodiment, since the planar illuminating device 111 which uses one of the laser emission devices of the first to tenth embodiments as a light source is adopted as a backlight illuminating device, high luminance which is uniform over the large area can be obtained. Further, since the output lights from the R light source 112a, the G light source 112b, and the B light source 112c which constitute the light source unit 112 have very high chromatic purities, the color reproduction range can be significantly extended. Furthermore, since the laser emission device of the present invention has a low current consumption, a low power consumption, and a long lifetime, the image display device of this twelfth embodiment can realize a low power consumption and a long lifetime.

Applicability in Industry

A laser emission device and an image display device using the same according to the present invention can provide a high-luminance and high-monochromaticity light with a high efficiency, a low power consumption, and a long lifetime, and therefore, they are useful in the field of displays such as a large-sized display and a high-luminance display.

The invention claimed is:

1. A laser emission device comprising:
   a plurality of laser elements;
   a plurality of laser driving power supplies which inject currents into the plural laser elements;
   optical elements which uniformize the laser light amount distributions of laser lights emitted from the plural laser elements;
   light-receiving elements which receive parts of the laser lights from the respective laser elements;
   a measurement unit which measures at least the respective operation current values of the plural laser elements and the output power values of the laser lights with respect to the operation current values; and
   a control unit which compares at least the operation current values of the plural laser elements and the output power values of the laser lights with respect to the operation current values among the plural laser elements, and operates the laser elements so that the laser elements having the higher efficiencies have the higher light output powers than the laser elements having the lower efficiencies.

2. A laser emission device as defined in claim 1 wherein said control unit selects the laser elements having the higher laser light output values with respect to the operation current values from among the plural laser elements, and operates only the selected laser elements.

3. A laser emission device as defined in claim 1 wherein said measurement unit further measures the respective operation voltages of the plural laser elements when measuring the output power values of the laser lights with respect to the operation current values of the plural laser elements, and
   said control unit operates the laser elements so that the laser elements having the higher efficiencies have the higher light output powers than the laser elements having the lower efficiencies, based on the electricity-to-light conversion efficiencies of the respective laser elements which are calculated from the output power values of the laser lights of the respective laser elements and the operation power values that are the products of the operation current values and the operation voltage values of the respective laser elements.

4. A laser emission device as defined in claim 1 wherein the control unit operates the laser elements so that the laser elements having the higher visual stimulus powers with respect to the operation current values have the higher light output powers than the laser elements having the lower visual stimulus powers, based on the operation current values of the laser elements and the visual stimulus powers that are the products of the visual stimulus coefficients as functions of the oscillation wavelengths of the laser elements and the output power values of the laser lights.

5. A laser emission device as defined in claim 3 including a plurality of laser elements having different oscillation wavelengths, and
said control unit operating the laser elements so that the laser elements having the higher visual stimulus efficiencies have the higher light output powers than the laser elements having the lower visual stimulus efficiencies, based on the visual stimulus efficiencies of the respective laser elements which are calculated from the operation current values of the laser elements and the visual stimulus powers that are the products of the visual stimulus coefficients as functions of the oscillation wavelengths of the respective laser elements and the output power values of the laser lights of the respective laser elements.

6. A laser emission device as defined in claim 4 wherein said measurement unit measures the oscillation wavelengths of the laser elements.

7. A laser emission device as defined in claim 1 wherein said measurement unit measures the temperatures of the laser elements.

8. A laser emission device as defined in claim 1 wherein said laser elements are intermittently driven by the laser driving power supplies.

9. A laser emission device as defined in claim 1 wherein said laser elements are operated with emitting the laser lights at the light output powers in a range from a predetermined rated value to 1.2 times of the rated value.

10. A laser emission device as defined in claim 1 wherein said measurement unit measures the operation current values or the operation power values of the laser elements which are operated with the output power values of the laser lights or the visual stimulus powers being kept at a constant value, and
said control unit includes a storage unit which stores the measured values obtained by the measurement unit for the respective laser elements, and an arithmetic unit which calculates the numerical changes of the measured values.

11. A laser emission device as defined in claim 7 wherein the temperatures of said laser elements are varied when emitting laser lights,
said measurement unit measures the output power values of the laser lights or the visual stimulus powers with respect to the laser element temperatures for the respective laser elements, and
said control unit includes a storage unit which stores the output power values of the laser lights or the visual stimulus powers with respect to the laser element temperatures for the respective laser elements, and controls the light output powers of the respective laser elements according to the laser element temperatures by using the values stored in the storage unit.

12. A laser emission device as defined in claim 7 wherein the temperatures of said laser elements are varied when emitting laser lights,
said measurement unit measures the output power values of the laser lights and the operation current values or the operation power values with respect to the laser element temperatures, and
said control unit includes a storage unit which stores the output power values of the laser lights and the operation current values or the operation power values with respect to the laser element temperatures, and operates the laser elements using the values stored in the storage unit when the laser emission device is started up.

13. A laser emission device as defined in claim 7 wherein the temperatures of said laser elements are varied when emitting laser lights,
said measurement unit measures the visual stimulus powers and the operation current values or the operation power values with respect to the laser element temperatures, and
said control unit includes a storage unit which stores the visual stimulus powers and the operation current values or the operation power values with respect to the laser element temperatures, and operates the laser elements using the values stored in the storage unit when the laser emission device is started up.

14. A laser emission device as defined in claim 1 including N pieces of laser elements (N: integer satisfying $N \geq 2$), and (N−1) or less pieces of laser elements among the N pieces of laser elements being selected to make them emit lights.

15. A laser emission device as defined in claim 14 wherein an electricity-to-light conversion efficiency P2[W]/P1[W] which is obtained by dividing the output power value P2[W] of the laser light of the laser element by the operation power value P1[W] is used as an emission efficiency, and the (N−1) or less pieces of laser elements are selected from the N pieces of laser elements in descending order of emission efficiency, and the selected laser elements are made to emit lights.

16. A laser emission device as defined in claim 14 wherein a visual stimulus efficiency $\alpha \times$P2[W]/P1[W] which is obtained by dividing the visual stimulus power $\alpha \times$P2[W] that is the product of the output power value P2[W] of the laser light of the laser element and the visual stimulus coefficient a by the operation power value P1[W] is used as an emission efficiency, and the (N−1) or less pieces of laser elements are selected from the N pieces of laser elements in descending order of emission efficiency, and the selected laser elements are made to emit lights.

17. A laser emission device as defined in claim 14 wherein the (N−1) or less pieces of laser elements are selected from the N pieces of laser elements in ascending order of oscillation threshold value to make the selected laser elements emit lights.

18. A laser emission device as defined in claim 17 wherein calculations of the emission efficiencies and the oscillation threshold values are performed while the laser elements are manufactured.

19. A laser emission device as defined in claim 17 wherein calculations of the emission efficiencies and the oscillation threshold values are performed immediately before the laser emission device is used.

20. A laser emission device as defined in claim 17 wherein calculations of the emission efficiencies and the oscillation threshold values are performed while the laser emission device is used.

21. A laser emission device as defined in claim 15 wherein the (N−1) or less pieces of laser elements are selected from the N pieces of laser elements in descending order of emission efficiency, and the selected laser elements are made to emit lights at the laser light output power values corresponding to the characteristics of the emission efficiencies.

22. A laser emission device as defined in claim 15 wherein calculation of the emission efficiencies is performed while the respective N pieces of laser elements are lighted, and when the emission efficiency of a laser element which is lighted becomes lower than the emission efficiency of a laser element which is not lighted, the laser element being lighted is replaced.

23. A laser emission device as defined in claim 17 wherein the (N−1) or less pieces of laser elements are selected from the N pieces of laser elements in ascending order of oscillation threshold value, and the selected laser elements are made to emit lights at the laser light output power values corresponding to the characteristics of the oscillation threshold values.

24. A laser emission device as defined in claim 17 wherein calculation of the oscillation threshold values is performed while the respective N pieces of laser elements are lighted, and
when the oscillation threshold value of a laser element which is lighted becomes higher than the oscillation threshold value of a laser element which is not lighted, the laser element being lighted is replaced.

25. An image display device comprising:
a laser light source which emits laser light;
a spatial modulation element which modulates the laser light emitted from the laser light source; and
said laser emission device disclosed in claim 1 being used as said laser light source.

26. An image display device comprising:
a plurality of laser light sources;
a projection unit which projects laser lights emitted from the laser light sources; and
said laser emission device disclosed in claim 1 being used as said laser light sources.

27. An image display device as defined in claim 25 including
laser light sources which emit red, green, and blue laser lights, respectively, and
the visual stimulus efficiency of the laser light source of at least one color among red, green, and blue being calculated to control the color temperature of the image display device.

28. An image display device as defined in claim 25 including
laser light sources of four or more colors including at least red, green, and blue, and
said laser light sources of the respective colors being controlled so that the output powers from the laser light sources having the higher visual stimulus efficiencies become larger.

* * * * *